(12) United States Patent
Tanabe et al.

(10) Patent No.: US 10,796,939 B2
(45) Date of Patent: Oct. 6, 2020

(54) TEMPORARY ADHESIVE FILM ROLL FOR SUBSTRATE PROCESSING, METHOD FOR MANUFACTURING THIN WAFER

(71) Applicant: SHIN-ETSU CHEMICAL CO., LTD., Tokyo (JP)

(72) Inventors: Masahito Tanabe, Annaka (JP); Michihiro Sugo, Takasaki (JP); Kazunori Kondo, Takasaki (JP); Hiroyuki Yasuda, Tomioka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 155 days.

(21) Appl. No.: 15/991,533

(22) Filed: May 29, 2018

(65) Prior Publication Data

US 2018/0350650 A1    Dec. 6, 2018

(30) Foreign Application Priority Data

Jun. 5, 2017 (JP) ................................. 2017-110941

(51) Int. Cl.
*H01L 21/683* (2006.01)
*C09J 183/04* (2006.01)
(Continued)

(52) U.S. Cl.
CPC ............ *H01L 21/6836* (2013.01); *C09J 5/06* (2013.01); *C09J 7/10* (2018.01); *C09J 183/04* (2013.01);
(Continued)

(58) Field of Classification Search
CPC ........ H01L 21/6836; H01L 2221/68381; C09J 5/06; C09J 7/10; C09J 7/40; C09J 163/00;
(Continued)

(56) References Cited

U.S. PATENT DOCUMENTS 5,961,768 A * 10/1999 Tsujimoto ......... H01L 21/67132
156/285
6,258,426 B1 * 7/2001 Yamamoto ............. C09J 7/0246
283/81
(Continued)

FOREIGN PATENT DOCUMENTS

EP    3 101 681 A1    12/2016
EP    3 174 091 A1    5/2017
(Continued)

OTHER PUBLICATIONS

Nov. 28, 2018 Extended European Search Report issued in European Patent Application No. 18175676.8.
(Continued)

*Primary Examiner* — Scott R. Walshon
(74) *Attorney, Agent, or Firm* — Oliff PLC

(57) ABSTRACT

A temporary adhesive film roll for substrate processing, includes: a roll axis and a composite film-shaped temporary-adhesive material for temporarily bonding a substrate to a support, the composite film-shaped temporary-adhesive material being rolled up around the roll axis; wherein the composite film-shaped temporary-adhesive material includes a first temporary adhesive layer composed of a thermoplastic resin, a second temporary adhesive layer composed of a thermosetting resin, and a third temporary adhesive layer composed of a thermosetting resin which is different from that of the second temporary adhesive layer. The temporary adhesive film roll for substrate processing is capable of giving a temporary adhesive material which facilitates temporary adhesion between a substrate and a support, rapidly forms a temporary adhesive material layer on a substrate or a support, has excellent resistance to a thermal process such as chemical vapor deposition, and is easily separated to improve the productivity of thin wafers.

21 Claims, 1 Drawing Sheet

(51) Int. Cl.
*C09J 7/10* (2018.01)
*C09J 5/06* (2006.01)
*C08G 77/20* (2006.01)
*C08G 77/12* (2006.01)

(52) U.S. Cl.
CPC .............. *C08G 77/12* (2013.01); *C08G 77/20* (2013.01); *C09J 2201/36* (2013.01); *C09J 2201/61* (2013.01); *C09J 2203/326* (2013.01); *C09J 2483/00* (2013.01); *H01L 2221/68381* (2013.01)

(58) Field of Classification Search
CPC .. C09J 183/04; C09J 2201/36; C09J 2201/61; C09J 2203/326; C09J 2483/00; C08G 77/12; C08G 77/20
See application file for complete search history.

(56) References Cited

U.S. PATENT DOCUMENTS

| | | | |
|---|---|---|---|
| 7,541,264 B2 | 6/2009 | Gardner et al. | |
| 9,646,868 B2* | 5/2017 | Yasuda | C09J 7/29 |
| 9,934,996 B2* | 4/2018 | Sugo | H01L 21/304 |
| 9,941,145 B2* | 4/2018 | Tanabe | B32B 9/04 |
| 10,128,143 B2* | 11/2018 | Tanabe | C08K 5/56 |
| 10,242,902 B2* | 3/2019 | Sugo | C08K 5/56 |
| 2003/0054643 A1* | 3/2003 | Aihara | H01L 21/6836 438/689 |
| 2005/0233547 A1 | 10/2005 | Noda et al. | |
| 2010/0233409 A1* | 9/2010 | Kamiya | H01L 24/83 428/41.5 |
| 2014/0154868 A1 | 6/2014 | Sugo et al. | |
| 2016/0189996 A1* | 6/2016 | Tanabe | C09J 183/04 428/354 |
| 2016/0189998 A1* | 6/2016 | Yasuda | H01L 21/304 438/692 |
| 2016/0326414 A1 | 11/2016 | Tagami et al. | |
| 2017/0004989 A1* | 1/2017 | Tanabe | B32B 27/325 |
| 2017/0053821 A1* | 2/2017 | Sugo | H01L 21/304 |
| 2017/0069521 A1* | 3/2017 | Sugo | B32B 27/26 |
| 2017/0154801 A1 | 6/2017 | Tagami et al. | |

FOREIGN PATENT DOCUMENTS

| | | |
|---|---|---|
| JP | 2004-064040 A | 2/2004 |
| JP | 2006-328104 A | 12/2006 |
| JP | 2013-179135 A | 9/2013 |
| JP | 2014-131004 A | 7/2014 |
| JP | 2017-098474 A | 6/2017 |

OTHER PUBLICATIONS

Mar. 17, 2020 Office Action issued in Japanese Patent Application No. 2017-110941.

* cited by examiner

TEMPORARY ADHESIVE FILM ROLL FOR SUBSTRATE PROCESSING, METHOD FOR MANUFACTURING THIN WAFER

TECHNICAL FIELD

The present invention relates to a temporary adhesive film roll for substrate processing, and a method for manufacturing a thin wafer.

BACKGROUND ART

Three-dimensional semiconductor mounting has become essential for higher density and larger capacity. The three-dimensional mounting technique is a semiconductor production technique for thinning a semiconductor chip and connecting the chip to another chip by a through silicon via (TSV) electrode to form a multilayer. To realize this technique, steps of grinding a non-circuit-forming surface (also referred to as "back surface") of a substrate on which a semiconductor circuit has been formed to thin the substrate, and then forming an electrode including a TSV on the back surface, are required.

In the step of grinding the back surface of a silicon substrate, a protective tape for the back surface is conventionally attached to a surface opposite to the surface to be ground to prevent the wafer from breaking during grinding. However, this tape uses an organic resin film as the base material, which has flexibility, but inadequate strength and heat resistance. Thus, this tape is not suited to the steps of forming a TSV and forming a wiring layer on the back surface.

In this context, there has been proposed a system in which a semiconductor substrate is bonded to a support made of silicon, glass or the like, through an adhesive layer to sufficiently withstand the steps of grinding the back surface and forming a TSV and an electrode on the back surface. In this system, the adhesive layer used for bonding the substrate to the support is important. The adhesive layer requires a sufficient durability to bond the substrate and the support without gaps and to withstand subsequent steps, and also requires an ability to easily detach a thin wafer from the support finally. The adhesive layer, which is finally removed, is hence referred herein to as "temporary adhesive layer" (or temporary adhesive material layer).

With respect to the conventionally known temporary adhesive layer and a method for removing this layer, the following techniques have been proposed: high intensity light is irradiated to an adhesive material containing a light-absorbing substance to decompose the adhesive material layer whereby the adhesive material layer is removed from the support (Patent Literature 1); a heat fusible hydrocarbon compound is used for the adhesive material, and bonding and removal are carried out in a heat-molten state (Patent Literature 2). The former technique has problems of requiring expensive tools such as laser, and a long treatment time per substrate. The latter technique is simple because of control only by heat, but thermal stability is insufficient at a high temperature exceeding 200° C., and thus the applicable range is limited. Furthermore, these temporary adhesive layers are not adequate to form a film with uniform thickness on a heavily stepped substrate and to provide a complete adhesion to the support.

Besides, it has been proposed to use a silicone adhesive for the temporary adhesive material layer (Patent Literature 3). In this technique, a substrate is bonded to a support with an addition-curable silicone adhesive, and on the removal, the assembly is immersed in a chemical solution capable of dissolving or decomposing the silicone resin to separate the substrate from the support. Thus in this method, every substrate has to be coated with the silicone adhesive, the separation takes a very long time, and the adhesive is laminated onto a substrate or a support directly in a solution state, causing a deformation due to unevenness in coating between the central surface and the peripheral surface of the substrate in a coating process. Accordingly, this method is difficulty applied to the actual manufacturing process.

Patent Literature 4 describes a temporary-adhesive material layer in which a thermoplastic resin and a thermosetting resin are laminated. In this method, liquid temporary-adhesive material is applied to a substrate or a support previous to the use, there is a problem of taking a time to obtain a substrate or a support on which the temporary-adhesive material layer is formed, together with the problem of causing a deformation as in Patent Literature 3, remaining unsolved. Additionally, this method uses a resin layer that is fluidal in the temperature range during the process, and is problematic, particularly in a use at higher temperature range.

CITATION LIST

Patent Literature

PATENT LITERATURE 1: Japanese Patent Laid-Open Publication No. 2004-64040
PATENT LITERATURE 2: Japanese Patent Laid-Open Publication No. 2006-328104
PATENT LITERATURE 3: U.S. Pat. No. 7,541,264
PATENT LITERATURE 4: Japanese Patent Laid-Open Publication No. 2014-131004

SUMMARY OF THE INVENTION

Technical Problem

The present invention was accomplished in view of the above-described problems. It is an object of the present invention to provide a temporary adhesive film roll for substrate processing capable of giving a temporary adhesive material which facilitates temporary adhesion between a substrate and a support, rapidly forms a temporary adhesive material layer on a substrate or a support, has excellent dimensional resistance and excellent resistance to a thermal process such as chemical vapor deposition (CVD), and is easily separated to improve the productivity of thin wafers, and further provide a method for manufacturing a thin wafer using the same.

Solution to Problem

To accomplish the object, the present invention provides a temporary adhesive film roll for substrate processing, comprising:

a roll axis and a composite film-shaped temporary-adhesive material for temporarily bonding a substrate to be processed to a support, the composite film-shaped temporary-adhesive material being rolled up around the roll axis;

wherein the composite film-shaped temporary-adhesive material includes a first temporary adhesive layer (A) composed of a thermoplastic resin, a second temporary adhesive layer (B) composed of a thermosetting resin, and a third temporary adhesive layer (C) composed of a thermosetting resin which is different from that of the second temporary adhesive layer.

With such an inventive temporary adhesive film roll for substrate processing, three layers of temporary adhesive material layers can be laminated collectively and concurrently by laminating the composite film-shaped temporary-adhesive material onto a substrate or a support. Accordingly, the present invention makes it possible to easily obtain a laminate in which a temporary adhesive material layer is formed on a support and a substrate to be processed is laminated on the temporary adhesive material layer.

The inventive temporary adhesive film roll for substrate processing as described above can be a temporary adhesive film roll for substrate processing that can give a temporary adhesive material which facilitates temporary adhesion between a substrate and a support, excellent in dimensional resistance, exhibits high rate of forming a temporary adhesive material layer, has high conformity with a process including TSV formation and a process of back surface wiring of a substrate, has excellent resistance to a thermal process such as CVD, and is easily separated to improve the productivity of thin substrates.

In this case, it is preferable that the temporary adhesive film roll for substrate processing further comprise a release backing, wherein
the release backing and the composite film-shaped temporary-adhesive material formed on the release backing are rolled up around the roll axis together, and
the composite film-shaped temporary-adhesive material include the first temporary adhesive layer (A), the second temporary adhesive layer (B), and the third temporary adhesive layer (C) formed in order from a side of the release backing.

In the inventive temporary adhesive film roll for substrate processing, it is preferable that the release backing is rolled up together with the composite film-shaped temporary-adhesive material in which the temporary adhesive material layer is formed in such an order.

In this case, it is preferable that the cured film of the second temporary adhesive layer (B) exhibit a modulus of 50 MPa or more and 1 GPa or less at 25° C. measured by dynamic viscoelasticity measurement.

The second temporary adhesive layer (B) that forms a cured material having such a modulus prevents the substrate from warping when it is temporarily adhered, particularly after grinding the substrate, thereby being preferable.

In this case, it is preferable that the cured film of the third temporary adhesive layer (C) exhibit a peeling force of 20 mN/25 mm or more and 500 mN/25 mm or less to peel the cured film from the substrate or the support in a peel test at 25° C. in a direction of 180° degree.

The third temporary adhesive layer (C) that forms a cured material having such a peeling force is more excellent in resistance to CVD, which is a post processing, prevents the substrate from slipping out of place during grinding of the substrate, and facilitates the separation, thereby being preferable.

In this case, it is preferable that the third temporary adhesive layer (C) be a layer of a composition containing:
(C1) an organopolysiloxane having an alkenyl group in the molecule;
(C2) an organohydrogenpolysiloxane having two or more silicon atom-bonded hydrogen atoms (Si—H groups) per molecule, in such an amount that a mole ratio of the Si—H group in the component (C2) to the alkenyl group in the component (C1) ranges from 0.3 to 15; and
(C3) a platinum-based catalyst.

The third temporary adhesive layer (C) composed of such a thermosetting resin can be efficiently separated from the substrate or the support, thereby being preferable.

In this case, it is preferable that the second temporary adhesive layer (B) be a polymer layer composed of a composition containing 100 parts by mass of a siloxane bond-containing polymer having a repeating unit shown by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol groups or alkoxymethylol groups per molecule, and an epoxy compound having on average two or more epoxy groups per molecule,

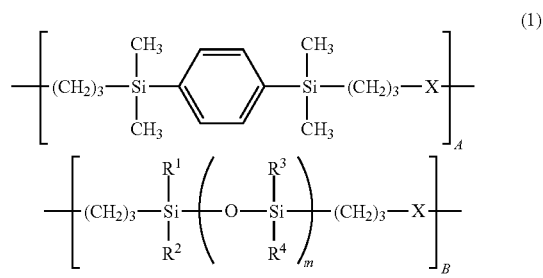

wherein $R^1$ to $R^4$ may be the same or different, and represent a monovalent hydrocarbon group having 1 to 8 carbon atoms; "m" is an integer of 1 to 100; B is a positive number; A is 0 or a positive number, with the proviso that A+B=1; and X is a divalent organic group shown by the following general formula (2),

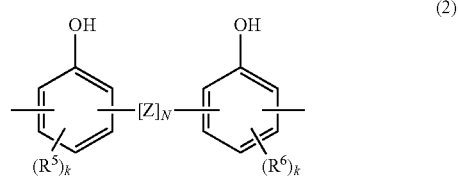

wherein Z represents a divalent organic group selected from any of

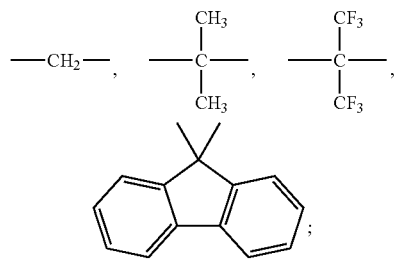

N represents 0 or 1; $R^5$ and $R^6$ each represent an alkyl or alkoxy group having 1 to 4 carbon atoms, and may be the same or different from each other; and "k" represents any of 0, 1, and 2.

Such a second temporary adhesive layer (B) is more excellent in heat resistance, thereby being preferable.

In this case, it is preferable that the second temporary adhesive layer (B) be a polymer layer composed of a composition containing 100 parts by mass of a siloxane bond-containing polymer having a repeating unit shown by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

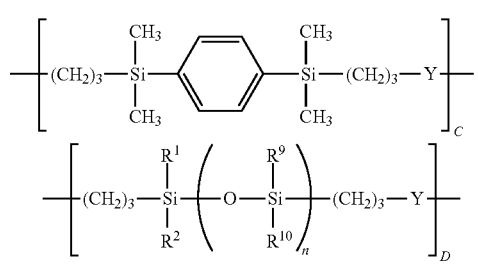

(3)

wherein $R^7$ to $R^{10}$ may be the same or different, and represent a monovalent hydrocarbon group having 1 to 8 carbon atoms; "n" is an integer of 1 to 100; D is a positive number; C is 0 or a positive number, with the proviso that C+D=1; and Y is a divalent organic group shown by the following general formula (4),

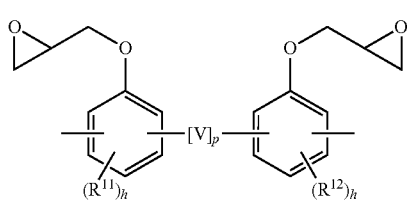

(4)

wherein V represents a divalent organic group selected from any of

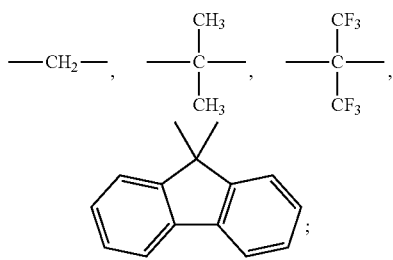

"p" represents 0 or 1; $R^{11}$ and $R^{12}$ each represent an alkyl or alkoxy group having 1 to 4 carbon atoms, and may be the same or different from each other; and "h" represents any of 0, 1, and 2.

Such a second temporary adhesive layer (B) is more excellent in heat resistance, thereby being preferable.

In this case, it is preferable that the peeling force is 10 mN/25 mm or more and 400 mN/25 mm or less to peel the release backing from the composite film-shaped temporary-adhesive material in a peel test at 25° C. in a direction of 180° degree.

Such a composite film-shaped temporary-adhesive material can separate the release backing easily, and further facilitates temporary bonding of a substrate and a support thereby.

The present invention also provides a method for manufacturing a thin wafer comprising the steps of:
(a) bonding a surface opposite to a surface to be processed of the substrate to the support by using the temporary adhesive film roll for substrate processing described above, wherein the composite film-shaped temporary-adhesive material is unwound from the temporary adhesive film roll, and the composite film-shaped temporary-adhesive material is laminated onto the substrate or the support to bond the substrate and the support through the composite film-shaped temporary-adhesive material under reduced pressure;
(b) heat curing the second temporary adhesive layer (B) and the third temporary adhesive layer (C);
(c) grinding or polishing the surface to be processed of the substrate;
(d) processing the surface to be processed of the substrate;
(e) separating the substrate subjected to the processing from the support.

Such a method for manufacturing a thin wafer facilitates manufacturing of a thin wafer having a through electrode structure or a bump connection structure by using this temporary adhesive material layer such that the composite film-shaped temporary-adhesive material is unwound from the inventive temporary adhesive film roll for substrate processing and is used for bonding a substrate and a support.

Advantageous Effects of Invention

With the inventive temporary adhesive film roll for substrate processing, three layers of temporary adhesive material layers can be laminated collectively and concurrently by laminating the composite film-shaped temporary-adhesive material onto a substrate or a support. By collectively using the composite film-shaped temporary-adhesive material as described above, it is possible to largely shorten the time for forming a temporary adhesive material layer on a substrate or a support compared that in a case of using a liquid temporary adhesive material. The deformation of a laminate is also decreased, since the dimension resistance of a temporary adhesive material formed on the surface of a substrate or a support is improved. The present invention is highly compatible with forming a TSV or forming a wiring on the back surface of a substrate. Being in a form of a multilayered film-shaped temporary adhesive roll, the filling property and heat resistance are improved, and a breakable thin substrate can be easily manufactured since the substrate can be easily separated from a support at a room temperature, for example, after manufacturing this thin substrate.

DESCRIPTION OF EMBODIMENTS

As described above, it has been desired to develop a temporary adhesive material for processing a substrate which facilitates temporary adhesion, rapidly forms a temporary adhesive material layer on a substrate or a support, has excellent dimensional resistance and excellent resistance to a thermal process of a substrate such as CVD, and is easily separated to improve the productivity of thin substrates.

The present inventors have earnestly studied to accomplish the above object and consequently found a method that can easily manufacture a thin wafer having a through electrode structure or a bump interconnect structure by using a roll-shaped temporary adhesive material comprising a composite film-shaped temporary-adhesive material including:
(A) a first temporary adhesive layer composed of a thermoplastic resin;
(B) a second temporary adhesive layer composed of a thermosetting resin; and
(C) a third temporary adhesive layer composed of a thermosetting resin which is different from that of the second temporary adhesive layer. Hereinafter, the present invention will be described in more detail.

Figure 1:
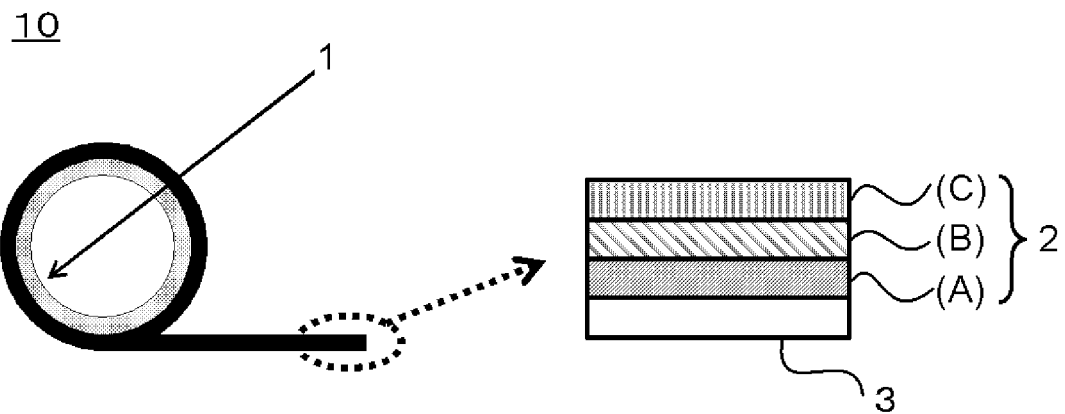
FIG. 1 is a block diagram to show an example of the inventive temporary adhesive film roll for substrate processing.

FIG. 1 is a block diagram to show an example of the inventive temporary adhesive film roll for substrate processing. As shown in FIG. 1, the inventive temporary adhesive film roll for substrate processing 10 is provided with the roll axis 1 and the composite film-shaped temporary-adhesive material 2 for temporarily bonding a support and a substrate to be processed, with the temporary adhesive material being rolled up around the roll axis 1, and the composite film-shaped temporary-adhesive material 2 includes a first temporary adhesive layer (A) composed of a thermoplastic resin, a second temporary adhesive layer (B) composed of a thermosetting resin, and a third temporary adhesive layer (C) composed of a thermosetting resin which is different from that of the second temporary adhesive layer.

As shown in FIG. 1, the inventive temporary adhesive film roll for substrate processing 10 preferably includes the release backing 3, wherein the composite film-shaped temporary-adhesive material 2 is formed on the release backing 3 and is rolled up around the roll axis 1, together with the release backing 3. In this case, the composite film-shaped temporary-adhesive material 2 preferably includes the first temporary adhesive layer (A), the second temporary adhesive layer (B), and the third temporary adhesive layer (C) formed in order from a side of the release backing 3.

Figure 2:
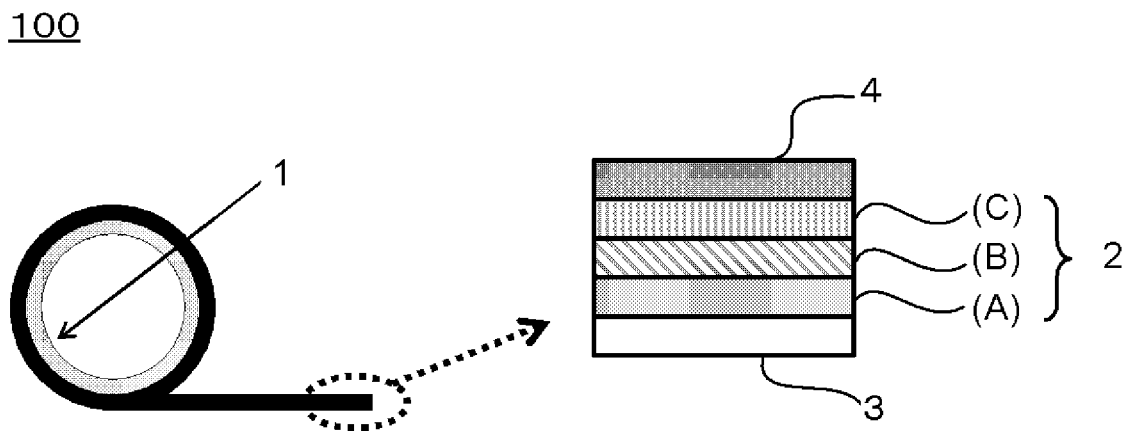
FIG. 2 is a block diagram to show another example of the inventive temporary adhesive film roll for substrate processing.

Alternatively, in the inventive temporary adhesive film roll for substrate processing 100, the protective film 4 is adhered to the composite film-shaped temporary-adhesive material 2 as necessary, and the assembly is rolled up around the roll axis 1 as shown in FIG. 2.

Figure 3:
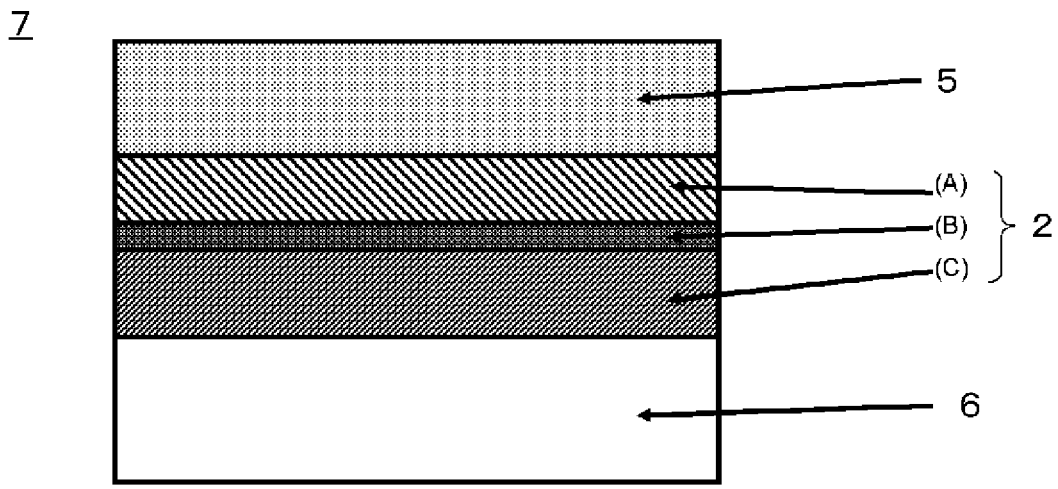
FIG. 3 is a block diagram to show an example of a laminate for processing a substrate manufactured by using a composite film-shaped temporary-adhesive material in the inventive temporary adhesive film roll for substrate processing.

For example, the composite film-shaped temporary-adhesive material 2 is unwound from the inventive temporary adhesive film roll for substrate processing 10 shown in FIG. 1, together with separating the release backing 3, and is adhered onto the surface of the substrate 5 to be processed, with the support 6 being adhered thereon, thereby giving the laminate 7 for thinning (FIG. 3).

This laminate 7 has a circuit surface on the front side and is provided with the substrate (device substrate) 5 the backside of which is to be processed, the support 6 to support the substrate 5 in processing the substrate 5, and the composite film-shaped temporary-adhesive material 2 interposing between the substrate 5 and the support 6, wherein this composite film-shaped temporary-adhesive material 2 includes a thermoplastic resin layer (A) (the first temporary adhesive layer), a thermosetting resin layer (B) (the second temporary adhesive layer), and a thermosetting resin layer which is different from that of the second temporary adhesive layer (C) (the third temporary adhesive layer) described below.

Hereinafter, the present invention will be mainly described on a structure of a temporary adhesive film roll for substrate processing that can manufacture the laminate 7 for thin processing shown in FIG. 3, that is, capable of forming the temporary adhesive layers such that the temporary adhesive layers in the order of (A), (B), and (C) from a side of the substrate, but the present invention is not limited thereto. In addition, the laminate 7 for thin processing, in which the composite film-shaped temporary-adhesive material 2 is formed between the substrate 5 and the support 6, manufactured by using the inventive temporary adhesive film roll for substrate processing has the temporary adhesive layers in the order of (A), (B), and (C). The laminate 7, however, can include another layer with the proviso that it includes the layers of (A), (B), and (C).

Each inventive temporary adhesive film roll for substrate processing 10 and 100 is a roll of laminate of adhesive that can be used for the laminate 7 for thin processing, and at least has the temporary adhesive layers (A), (B), and (C).

[Temporary Adhesive Material Layer]
—First Temporary Adhesive Layer (A)/Thermoplastic Resin Layer (Thermoplastic Polymer Layer)—

The first temporary adhesive layer (A) is composed of a thermoplastic resin. As a material for forming the first temporary adhesive layer (A), thermoplastic resins with good filling property are preferably used in view of applicability to a stepped substrate. Particularly, thermoplastic resins having a glass transition temperature of about −80 to 150° C. without containing organopolysiloxane are preferable, including olefinic thermoplastic elastomer, polybutadiene type thermoplastic elastomer, styrenic thermoplastic elastomer, styrene-butadiene type thermoplastic elastomer, and styrene-polyolefin type thermoplastic elastomer. Particularly preferable one is hydrogenated polystyrene type elastomer, which is excellent in heat resistance.

As the thermoplastic resin, commercially available articles can be used, including Tuftec (Asahi Kasei Corporation), ESPOLEX SB series (Sumitomo Chemical Corporation), RABALON (Mitsubishi Chemical Corporation), SEPTON (KURARAY CO., LTD.), and DYNARON (JSR Corporation), together with cycloolefin polymers represented by ZEONEX (ZEON CORPORATION) and cycloolefin copolymers represented by TOPAS (Polyplastics Co., Ltd.).

As described above, thermoplastic elastomer is preferable as a thermoplastic resin of the first temporary adhesive layer (A). It is also possible to use them in combination of two or more kinds.

The above resin facilitates handling of a breakable thin substrate since the temporary adhesive material can be removed or washed from the substrate more easily after manufacturing the thin substrate.

The above thermoplastic resin layer composition can be used for forming the temporary adhesive material layer after being dissolved to a solvent. Illustrative examples of the solvent include hydrocarbons, preferably nonane, p-menthane, pinene, isooctane, and mesitylene, in which nonane, p-menthane, isooctane, and mesitylene are more preferable in view of their coating properties. The solution can be subjected to filtration as necessary. Subsequently, it is applied onto the release backing 3 preferably by using a forward roll coater, a reverse roll coater, a comma coater, a die coater, a lip coater, a gravure coater, a dip coater, an air knife coater, a capillary coater, a raising & rising (R&R) coater, a blade coater, a bar coater, an applicator, and an extruder. Then, the release backing 3 coated with the (A) layer solution is subjected to in-line solvent removal to form the first temporary adhesive layer (A).

Although the film thickness is not particularly limited, the resin film (the first temporary adhesive layer (A)) is desirably formed on the release backing 3, and is preferably formed in a film thickness of 0.5 to 80 μm, more preferably 0.5 to 50 μm. To this thermoplastic resin, it is also possible to add antioxidant to improve the heat resistance or surfactant to improve the coating property. As an specific example of the antioxidant, di-t-butylphenol and so on are preferably used. As an example of the surfactant, fluorosilicone type surfactant X-70-1102 (available from Shin-Etsu Chemical Co., Ltd.), etc. can be preferably used.

—Second Temporary Adhesive Layer (B)/Thermosetting Resin Layer—

The thermosetting resin layer (B), which is a constitutional element of the inventive temporary adhesive film roll for substrate processing, is not particularly limited so long as it is composed of a thermosetting resin, but is preferably a polymer layer composed of a thermosetting resin composition containing the thermosetting siloxane-modified polymer shown by the following general formula (1) or (3) as the main ingredient.

It is to be noted that, the second temporary adhesive layer (B) can contain both of the polymer shown by the following general formula (1) and the polymer shown by the following general formula (3). In this case, the ratio (mass ratio) is preferably (1):(3)=0.1:99.9 to 99.9:0.1, more preferably (1):(3)=1:99 to 99:1.

Polymer of Formula (1) (Phenolic Siloxane Polymer):

The polymer having a repeating unit shown by the following general formula (1) is a siloxane bond-containing polymer, and preferably has a weight average molecular weight of 3,000 to 500,000, more preferably 10,000 to 100,000 in terms of polystyrene determined by gel permeation chromatography (GPC),

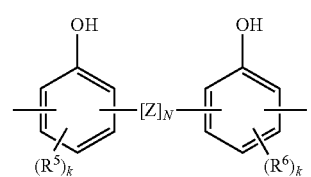

wherein Z represents a divalent organic group selected from any of

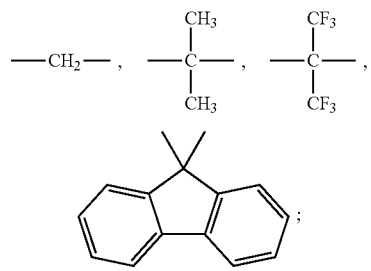

n represents 0 or 1; $R^5$ and $R^6$ each represent an alkyl or alkoxy group having 1 to 4 carbon atoms, and may be the same or different from each other; and "k" represents any of 0, 1, and 2.

In this case, illustrative examples of $R^1$ to $R^4$ include a methyl group, an ethyl group, a phenyl group, etc., "m" represents an integer of 1 to 100, preferably 3 to 60, more preferably 8 to 40. B/A is larger than 0 and smaller than 20, particularly from 0.5 to 5.

Polymer of Formula (3) (Epoxy-Modified Siloxane Polymer):

The polymer having a repeating unit shown by the following general formula (3) is a siloxane bond-containing polymer, and has a weight average molecular weight of 3,000 to 500,000 in terms of polystyrene determined by GPC,

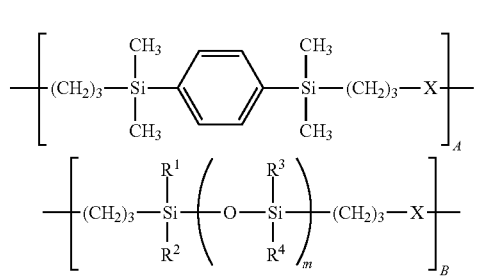

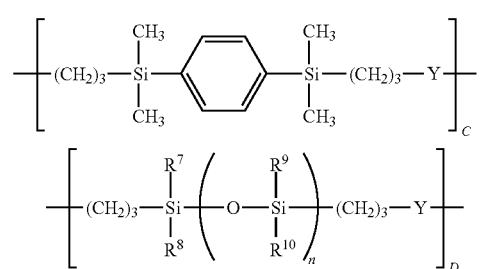

wherein $R^1$ to $R^4$ may be the same or different, and represent a monovalent hydrocarbon group having 1 to 8 carbon atoms; "m" is an integer of 1 to 100; B is a positive number; A is 0 or a positive number; and X is a divalent organic group shown by the following general formula (2); A+B=1, A is preferably 0 to 0.9, B is preferably 0.1 to 1, and when A is larger than 0, A is preferably 0.1 to 0.7 and B is preferably 0.3 to 0.9, wherein $R^7$ to $R^{10}$ may be the same or different, and represent a monovalent hydrocarbon group having 1 to 8 carbon atoms; "n" is an integer of 1 to 100; D is a positive number; C is 0 or a positive number; Y is a divalent organic group shown by the following general formula (4); C+D=1, C is preferably 0 to 0.9 and D is preferably 0.1 to 1, and when C is larger than 0, C is preferably 0.1 to 0.7 and D is preferably 0.3 to 0.9,

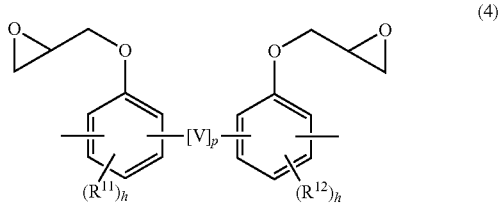

(4)

wherein V represents a divalent organic group selected from any of

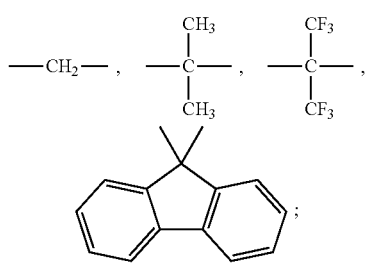

"p" represents 0 or 1; $R^{11}$ and $R^{12}$ each represent an alkyl or alkoxy group having 1 to 4 carbon atoms, and may be the same or different from each other; and "h" represents any of 0, 1, and 2.

In this case, illustrative examples of $R^7$ to $R^{10}$ are the same as those illustrated in $R^1$ to $R^4$ in the above general formula (1), "n" represents an integer of 1 to 100, preferably 3 to 60, more preferably 8 to 40. D/C is larger than 0 and smaller than 20, particularly from 0.5 to 5.

The thermosetting composition mainly consisting of the thermosetting siloxane-modified polymer of the above general formulae (1) and/or (3) contains one or more crosslinkers for heat curing. In the case of the phenolic siloxane polymer of the general formula (1), the crosslinker is selected from an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule.

Here, the amino condensate, the melamine resin, the urea resin each modified with formalin or formalin-alcohol may be exemplified by the following. For example, the melamine resin (condensate) modified with formalin or formalin-alcohol can be obtained by addition condensation polymerization of a modified melamine monomer (e.g. trimethoxymethyl monomethylol melamine), or a polymer thereof (e.g. oligomer such as dimer and trimer) with formaldehyde until a desired molecular weight is achieved, according to a known method. These compounds may be used alone or in combination of two or more kinds.

The urea resin (condensate) modified with formalin or formalin-alcohol can be prepared by modifying a urea condensate having a desired molecular weight with formalin into a methylol form, and optionally, further modifying the resultant compound with an alcohol into an alkoxy form, according to a known method. Illustrative examples of the urea resin modified with formalin or formalin-alcohol include methoxymethylated urea condensate, ethoxymethylated urea condensate, and propoxymethylated urea condensate. These compounds may be used alone or in combination of two or more kinds.

Illustrative examples of the phenol compound having on average two or more methylol or alkoxymethylol groups per molecule include (2-hydroxy-5-methyl)-1,3-benzenedimethanol and 2,2',6,6'-tetramethoxymethyl-bisphenol A. These phenol compounds may be used alone or in combination of two or more kinds.

On the other hand, in the case of the epoxy-modified siloxane polymer of the general formula (3), the composition contains one or more crosslinkers selected from an epoxy compound having on average two or more epoxy groups per molecule and a phenol compound having on average two or more phenol groups per molecule.

Here, the epoxy compound having a polyfunctional epoxy group used in the polymers of the general formulae (1) and/or (3) is not particularly limited. In particular, a bi-functional, a tri-functional, or a tetra-functional or more of the polyfunctional epoxy resins, for example, EOCN-1020, EOCN-102S, XD-1000, NC-2000-L, EPPN-201, GAN, and NC6000 all available from Nippon Kayaku Co., Ltd., or a crosslinker shown by any of the following formulae may be contained.

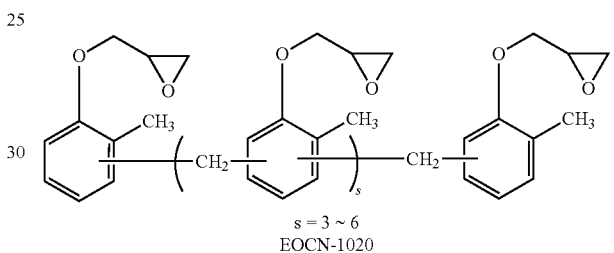

s = 3 ~ 6
EOCN-1020

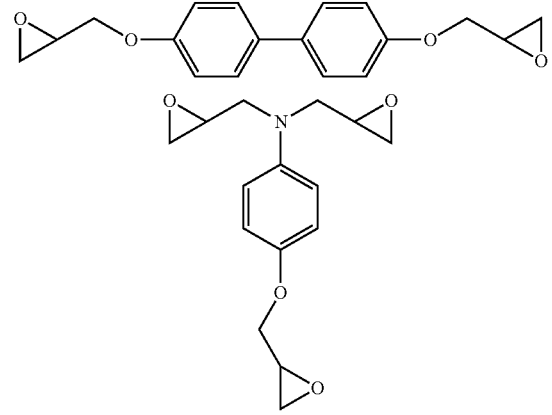

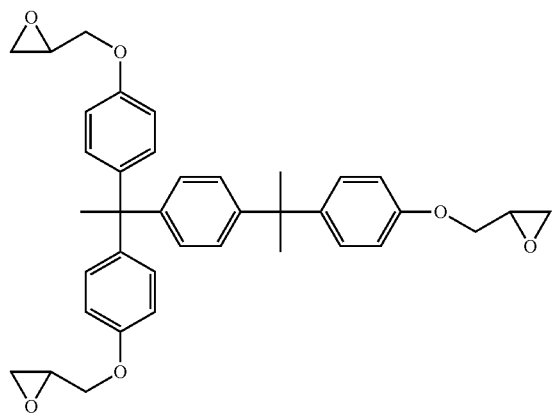

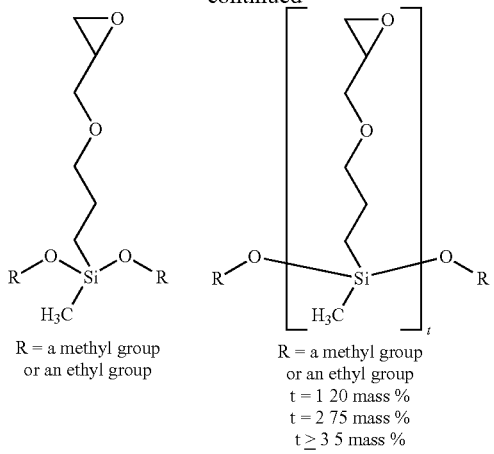

R = a methyl group or an ethyl group

R = a methyl group or an ethyl group
t = 1 20 mass %
t = 2 75 mass %
t ≥ 3 5 mass %

In the case that the thermosetting polymer is the epoxy-modified siloxane polymer of the above general formula (3), examples of the phenol compound having on average two or more phenol groups per molecule as the crosslinker include m- or p-cresol-novolac resins such as EP-6030G available from Asahi Organic Chemicals Industry Co., Ltd., tri-functional phenol compounds such as Tris-P-PA4 available from Honshu Chemical Industry Co., Ltd., and tetra-functional phenol compounds such as TEP-TPA available from Asahi Organic Chemicals Industry Co., Ltd., etc.

The formulation amount of the crosslinker can be 0.1 to 50 parts by mass, preferably 0.1 to 30 parts by mass, more preferably 1 to 20 parts by mass based on 100 parts by mass of the thermosetting polymer of the above general formulae (1) and/or (3). Two, three or more crosslinkers may be blended in combination.

A curing catalyst such as an acid anhydride may be added in an amount of 10 parts by mass or less based on 100 parts by mass of the thermosetting polymer.

The composition of the thermosetting resin layer can be dissolved in a solvent and used for forming the temporary adhesive material layer as the (B) layer solution. Illustrative examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These solvents may be used alone or in combination of two or more kinds. The solution can be subjected to filtration as necessary. Subsequently, it is applied onto the (A) layer formed on a release backing by the same method as in the (A) layer, followed by removing the solvent to form the (B) layer.

In addition, a known antioxidant and a filler such as silica may be added in an amount of 50 parts by mass or less based on 100 parts by mass of the thermosetting polymer to improve heat resistance. Moreover, a surfactant may be added to improve coating uniformity.

Illustrative examples of the antioxidant that can be added into the second temporary adhesive layer (B) include hindered phenol compounds such as tetrakis[methylene-(3,5-di-tert-butyl-4-hydroxyhydrocinnamate)]methane (product name: Adekastab AO-60).

The film to be formed preferably has a film thickness of 5 to 150 μm, more preferably 10 to 120 μm, although the film thickness is not particularly limited. When the film thickness is 5 μm or more, it can sufficiently withstand the grinding step for thinning the substrate. When the film thickness is 150 μm or less, the resin is prevented from deforming in the heat treatment process such as TSV formation process, and can be put to practical use.

—Third Temporary Adhesive Layer (C)/Thermosetting Resin Layer—

The third temporary adhesive layer (C), which is a constitutional element of the inventive temporary adhesive film roll for substrate processing, is composed of a thermosetting resin which is different from that of the second temporary adhesive layer, and is preferably a composition containing the following components (c1), (c2), and (c3).

(c1) an organopolysiloxane having an alkenyl group(s) in the molecule: 100 parts by mass;
(c2) an organohydrogenpolysiloxane having two or more silicon atom-bonded hydrogen atoms (Si—H groups) per molecule: an amount such that a mole ratio of the Si—H group in the component (c2) to the alkenyl group in the component (c1) ranges from 0.3 to 15;
(c3) a platinum-based catalyst: more than 0 parts by mass and 0.5 parts by mass or less as the effective component (in terms of mass).

Hereinafter, each component will be described.
[Component (c1)]

The component (c1) is an organopolysiloxane having an alkenyl group(s) in the molecule. The component (c1) is preferably a linear or branched organopolysiloxane containing 0.3 to 10 mol % of alkenyl groups based on the molar amount of the Si in one molecule (mole of alkenyl group/mole of Si). The organopolysiloxane particularly preferably contains 0.6 to 9 mol % of alkenyl groups based on the molar amount of the Si.

Illustrative examples of such organopolysiloxane include compounds shown by the following formula (5) and/or (6),

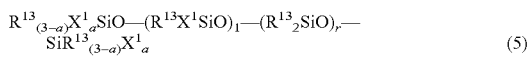 (5)

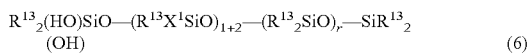 (6)

wherein $R^{13}$ independently represents a monovalent hydrocarbon group having no aliphatic unsaturated bond; $X^1$ independently represents a monovalent organic group containing an alkenyl group; and "a" is an integer of 0 to 3. In the formula (5), 2a+1 is such a number that the content of alkenyl group is 0.3 to 10 mol % per molecule. In the formula (6), 1+2 is such a number that the content of alkenyl group is 0.3 to 10 mol % per molecule, "l" is 0 or a positive number of 500 or less, and "r" is a positive number of 1 to 10,000.

In the above formulae, $R^{13}$ is preferably a monovalent hydrocarbon group having 1 to 10 carbon atoms and no aliphatic unsaturated bond. Examples thereof include alkyl groups such as a methyl group, an ethyl group, a propyl group, and a butyl group; cycloalkyl groups such as a cyclohexyl group; and aryl groups such as a phenyl group and a tolyl group. In particular, alkyl groups such as a methyl group and a phenyl group are preferable.

$X^1$, a monovalent organic group having an alkenyl group, is preferably an organic group having 2 to 10 carbon atoms. Examples thereof include alkenyl groups such as a vinyl group, an allyl group, a hexenyl group, and an octenyl group; (meth)acryloylalkyl groups such as an acryloylpropyl group, an acryloylmethyl group, and a methacryloylpropyl group; (meth)acryloxyalkyl groups such as an acryloxypropyl group, an acryloxymethyl group, a methacryloxypropyl group, and a methacryloxymethyl group; and alkenyl group-containing monovalent hydrocarbon groups such as a cyclohexenylethyl group and a vinyloxypropyl group. In particular, a vinyl group is industrially preferable.

In the general formula (5), "a" is an integer of 0 to 3, preferably 1 to 3. This preferable range allows terminals of the molecular chain to be blocked with alkenyl groups, and thus the reaction can be completed within a short time by the alkenyl groups with good reactivity at the terminal of the molecular chain. Furthermore, a=1 is industrially preferred in view of the cost. This alkenyl group-containing organopolysiloxane is preferably in an oil state or a crude rubber state. The alkenyl group-containing organopolysiloxane may be linear or branched. The component (c1) may be used in combination of two or more kinds.

It is to be noted that the component (c1) preferably has a number average molecular weight (Mn) of 100000 to 500000 determined by GPC.

[Component (c2)]

The component (c2) is a crosslinker, an organohydrogenpolysiloxane having two or more silicon-bonded hydrogen atoms (Si—H groups) per molecule. The component (c2) has at least two, preferably two or more and 100 or less, more preferably 3 or more and 50 or less silicon-bonded hydrogen atoms (SiH groups) per molecule, and may have a linear, branched, or cyclic structure.

The viscosity at 25° C. of the organohydrogenpolysiloxane, component (c2), is preferably 1 to 5,000 mPa·s, more preferably 5 to 500 mPa·s. The organohydrogenpolysiloxane may be a mixture of two or more kinds. It is to be noted that the viscosity is measured with a rotational viscometer.

The component (c2) is preferably blended such that a mole ratio of the Si—H group in the component (c2) to the alkenyl group in the component (c1) (Si—H group/alkenyl group) ranges from 0.3 to 15, particularly 0.3 to 10, more preferably 1 to 8. When the mole ratio between the SiH group and the alkenyl group is 0.3 or more, crosslinking density is not decreased, and the problem of inability to cure the adhesive layer is not caused. When the mole ratio is 15 or less, the crosslinking density is not excessively increased, and sufficient viscosity and tackiness can be achieved.

[Component (c3)]

The component (c3) is a platinum-based catalyst (i.e. platinum group metal catalyst). Examples thereof include chloroplatinic acid, an alcohol solution of chloroplatinic acid, a reaction product of chloroplatinic acid with alcohol, a reaction product of chloroplatinic acid with an olefin compound, and a reaction product of chloroplatinic acid with a vinyl group-containing siloxane.

The adding amount of the component (c3) is an effective amount, generally 1 to 5,000 ppm, preferably 5 to 2,000 ppm, in terms of (the mass of) platinum with respect to the total of (c1) and (c2). When the amount is 1 ppm or more, curability of the composition is not decreased, and crosslinking density and holding force are also not decreased. When the amount is 5,000 ppm or less, the available time of the solution to be treated can be prolonged.

The composition of the thermosetting resin layer can be dissolved in a solvent and used for forming the temporary adhesive material layer as a (C) layer solution. Illustrative examples of the solvent include hydrocarbon solvents such as pentane, hexane, cyclohexane, isooctane, nonane, decane, p-menthane, pinene, isododecane, and limonene; and volatile and low-molecular weight siloxanes such as hexamethyldisiloxane and octamethyltrisiloxane. These solvents may be used alone, or a combination of two or more kinds thereof. To this composition of a thermosetting siloxane polymer layer, a known antioxidant can be added to improve heat resistance. The solution can be subjected to filtration as necessary. Subsequently, it is applied onto the (B) layer by the same method as in the (A) layer and the (B) layer or applied onto the protective film 4, followed by removing the solvent to form the (C) layer.

In this case, the film to be formed preferably has a film thickness of 0.1 to 30 μm, particularly 1.0 to 15 μm. When the film thickness is 0.1 μm or more, it is separated from a substrate or a support more easily. When the film thickness is 30 μm or less, it can sufficiently withstand the grinding step for forming a thin wafer. This thermosetting siloxane polymer layer (C) may further contain a filler such as silica in an amount of 50 parts by mass or less based on 100 parts by mass of the thermosetting siloxane polymer (C), which is a total amount of mixing each component of (c1), (c2), and (c3).

The cured film of the third temporary adhesive layer (C) preferably exhibits a peeling force of 20 mN/25 mm or more and 500 mN/25 mm or less after heat curing to peel the cured film from a substrate or a support in a peel test at 25° C. in a direction of 180° degree. The third temporary adhesive layer (C) having such a peeling force is more excellent in resistance to CVD, which is a post processing, prevents the substrate from slipping out of place during grinding of the substrate, and facilitates the separation, thereby being preferable.

[Method for Manufacturing Temporary Adhesive Film Roll for Substrate Processing]

Hereinafter, the method for manufacturing the inventive temporary adhesive film roll for substrate processing will be specifically described, but the manufacturing method is not limited thereto.

The solution for (A) layer is applied onto the release backing (release film) 3 by using a forward roll coater, a reverse roll coater, a comma coater, a die coater, a lip coater, a gravure coater, a dip coater, an air knife coater, a capillary coater, a raising & rising (R&R) coater, a blade coater, a bar coater, an applicator, an extruder, etc. In this case, the solution is preferably applied onto a support film at a coating rate of 0.05 to 1000 m/min, particularly 0.1 to 500 m/min.

Subsequently, the release backing 3 coated with the solution for (A) layer is passed through an in-line drier (an internal air circulation oven), and is dried by removing the organic solvent and volatile component(s) at 40 to 130° C. for 1 to 40 minutes, more preferably 50 to 120° C. for 2 to 30 minutes to form the first temporary adhesive layer (A). Another protective film (release backing) may be laminated by contact bonding onto the first temporary adhesive layer (A) with a roll laminator as necessary. In this case, the first temporary adhesive layer (A) is preferably formed with a film thickness of 0.5 to 80 μm, particularly 0.5 to 50 μm.

Then, the solution for (B) layer is applied onto the first temporary adhesive layer (A) by using a forward roll coater, a reverse roll coater, a comma coater, a die coater, a lip coater, a gravure coater, a dip coater, an air knife coater, a capillary coater, a raising & rising (R&R) coater, a blade coater, a bar coater, an applicator, an extruder, etc. In this case, the solution is preferably applied onto the first temporary adhesive layer (A) at a coating rate of 0.05 to 1000 m/min, particularly 0.1 to 500 m/min.

Subsequently, the laminated film coated with the solution for (B) layer is passed through an in-line drier (an internal air circulation oven), and is dried by removing the organic solvent and volatile component(s) at 40 to 130° C. for 1 to 40 minutes, more preferably 50 to 120° C. for 2 to 30 minutes to form the second temporary adhesive layer (B). Another protective film (release backing) may be laminated by contact bonding onto the second temporary adhesive layer (B) with a roll laminator as necessary. In this case, the own thickness of the second temporary adhesive layer (B) is preferably 1 to 200 µm, particularly 5 to 100 µm.

Furthermore, the solution for (C) layer is applied onto the second temporary adhesive layer (B) by using a forward roll coater, a reverse roll coater, a comma coater, a die coater, a lip coater, a gravure coater, a dip coater, an air knife coater, a capillary coater, a raising & rising (R&R) coater, a blade coater, a bar coater, an applicator, an extruder, etc. In this case, the solution is preferably applied onto the second temporary adhesive layer (B) at a coating rate of 0.05 to 1000 m/min, particularly 0.1 to 500 m/min. Subsequently, the support film coated with the solution for (C) layer is passed through an in-line drier (an internal air circulation oven), and is dried by removing the organic solvent and volatile component(s) at 40 to 130° C. for 1 to 40 minutes, more preferably 50 to 120° C. for 2 to 30 minutes to form the third temporary adhesive layer (C). Another protective film (release backing) 4 may be laminated by contact bonding onto the third temporary adhesive layer (C) with a roll laminator as necessary. In this case, the own thickness of the third temporary adhesive layer (C) is preferably 0.5 to 50 µm, particularly 0.5 to 30 µm.

The composite film-shaped temporary-adhesive material 2 (and the release backing 3 and the protective film 4 as necessary) laminated as described above is rolled up directly or around the roll axis 1 such that the composite film-shaped temporary-adhesive material 2 is wound around a paper tube or a plastic tube from the terminal, thereby being changed to the temporary adhesive film roll for substrate processing 10.

In this case, the temporary adhesive film roll for substrate processing 10 can be obtained without causing deformation in the entire film by rolling up the composite film-shaped temporary-adhesive material 2 with a tension of 10 to 200 N/m, preferably 20 to 150 N/m at a rate of 0.05 to 1000 m/min, preferably 0.1 to 500 m/min.

When the protective film 4 is used, the process is preferably finished with lamination and roll-up with a two-stage roll.

It is to be noted that the diameter of the temporary adhesive film roll for substrate processing 10 is preferably 100 to 300 mm in view of stable manufacturing and the rolling habit around a roll axis, so-called curl-prevention. As the roll axis, a core tube can be used, for example.

The roll axis (e.g., a core tube) can have a size of 3 inches (76.2 mm) or 6 inches (152.4 mm), for example. When the roll axis is 3 inches in size, 5 m of a composite film-shaped temporary-adhesive material 2 is rolled up to form a temporary adhesive film roll for substrate processing 10 with a diameter of 100 mm, and 200 m of a composite film-shaped temporary-adhesive material 2 is rolled up to form a temporary adhesive film roll for substrate processing 10 with a diameter of 245 mm. When the roll axis is 6 inches in size, 5 m of a composite film-shaped temporary-adhesive material 2 is rolled up to form a temporary adhesive film roll for substrate processing 10 with a diameter of 172 mm, and 200 m of a composite film-shaped temporary-adhesive material 2 is rolled up to form a temporary adhesive film roll for substrate processing 10 with a diameter of 283 mm.

In the present invention, the composite film-shaped temporary-adhesive material 2 is changed to a roll film continuously to produce a composite film-shaped temporary-adhesive material 2 that can be treated to a desired shape by coating the release backing 3 with a coating solution with a production line using certain molding conditions and a molding machine. This is similar to the case in which a protective film is formed onto the produced layer.

The release film as the release backing 3 and the protective film 4, which can be used as necessary, are not particularly limited so long as the film can be separated from the surface layer of the composite film-shaped temporary-adhesive material 2 without losing the shape of each layer of the composite film-shaped temporary-adhesive material 2. These films may be a single layer film or a multilayer film in which a plurality of polymer films have been laminated. Plastic films can be used, and illustrative examples thereof include a nylon film, a polyethylene (PE) film, a polyethylene terephthalate (PET) film, a polyethylene naphthalate film, a polyphenylene sulfide (PPS) film, a polypropylene (PP) film, a polystyrene film, a polymethylpetene (TPX) film, a polycarbonate film, a fluorine-containing film, a special polyvinylalcohol (PVA) film, and a polyester film subjected to mold release treatment.

Among them, a polyethylene terephthalate film has appropriate flexibility, mechanical strength, and heat resistance, and is preferable as the release backing (release film) 3. These films may be subjected to various treatments such as corona treatment or coating with release agent. They can be commercially available articles including Cerapeel WZ (RX), Cerapeel BX8 (R) (each available from Toray Advanced Film Co., Ltd.); E7302, E7304 (each available from TOYOBO CO., LTD.); Purex G31, Purex G71T1 (each available from TEIJIN FILM SOLUTIONS LIMITED); PET 38×1-A3, PET 38×1-V8, PET38×1-X08 (each available from Nippa Co.).

As the protective film 4, a polyethylene terephthalate film and a polyethylene film, having appropriate flexibility, are preferable. They can be commercially available articles, and illustrative examples of the polyethylene terephthalate include the ones described above. Illustrative examples of the polyethylene include GF-8 (available from TAMAPOLY CO., LTD.), and PE film type 0 (available from nippa-co.).

Each thickness of the release backing 3 and the protective film 4 is preferably 10 to 100 µm in view of stable manufacturing and the rolling habit around a roll axis, so-called curl-prevention.

The composite film-shaped temporary-adhesive material unwound from the temporary adhesive film roll 10, which is produced by the above manufacturing method, excels in adhesion between the temporary adhesive layers, and excels in resistance to a vacuum thermal process such as CVD.

[Method for Manufacturing Thin Wafer]

The inventive method for manufacturing a thin wafer is characterized by using the composite film-shaped temporary-adhesive material 2 that is unwound from the inventive temporary adhesive film roll for substrate processing 10, namely, a roll film comprising a composite temporary-adhesive material layer that contains the first temporary adhesive layer (A), the second temporary adhesive layer (B), and the third temporary adhesive layer (C) for bonding the substrate on which a semiconductor circuit etc. have been formed to the support. The thickness of a thin wafer obtained by the inventive manufacturing method is typically 5 to 300 µm, more typically 10 to 100

The inventive method for manufacturing a thin wafer has the steps (a) to (e).

[Step (a)]

Step (a) is a step of bonding a surface opposite to a surface to be processed of the substrate to the support by using the inventive temporary adhesive film roll for substrate processing, wherein the composite film-shaped temporary-adhesive material 2 is unwound from the inventive temporary adhesive film roll 10, and the composite film-shaped temporary-adhesive material 2 is laminated onto the substrate 5 or the support 6 to bond the substrate 5 and the support 6 through the composite film-shaped temporary-adhesive material 2 under reduced pressure.

The substrate 5 to be processed is a substrate for example, having one of the surfaces of which is a circuit-forming surface, and the other surface (the back surface) of which is a non-circuit-forming surface to be processed. The substrate to which the present invention can be applied is normally a semiconductor substrate. As the semiconductor substrate, a disc-shaped wafer and a square substrate can be exemplified. Examples of the semiconductor wafer include not only a silicon wafer, but also a germanium wafer, a gallium-arsenic wafer, a gallium-phosphorus wafer, and a gallium-arsenic-aluminum wafer. The thickness of the wafer is typically, but not particularly limited to, 600 to 800 μm, more typically 625 to 775 μm.

The inventive method for manufacturing a thin wafer is particularly useful for a substrate 5 having a stepped substrate due to the circuit, particularly for a substrate having a step of 10 to 80 μm, typically 20 to 70 μm.

As the support 6, a substrate such as a silicon wafer, a glass plate, and a quartz wafer can be used without any limitation. In the present invention, it is not necessary to irradiate an energy beam to the temporary adhesive material layer through the support, so that the support does not have to be light transmittable.

The composite film-shaped temporary-adhesive material 2 can be unwound from the temporary adhesive film roll 10, with the composite temporary-adhesive material having the temporary-adhesive layers (A), (B), and (C) and being formed on the release backing of polyethylene, and polyester, etc. Then, this is laminated onto a substrate or a support, and is subjected to cut processing into a required length. Alternatively, this is subjected to cut processing into a required length, and then laminated onto a substrate or a support. In this case, the composite film-shaped temporary-adhesive material 2 can be formed on the substrate 5 while separating the release backing 3 therefrom as necessary. The surface of the (C) layer can also be formed on the support 6 while separating the protective film 4 or formed directly. The substrate 5 or the support 6 may be adhered while separating another protective film 4 or release backing 3.

The laminate may be used after being subjected to previous heat treatment at a temperature of 60 to 200° C., preferably 70 to 180° C. before or after separating the release backing 3 or the protective film 4 in order to improve adhesion.

The composite film-shaped temporary-adhesive material 2 can be laminated onto the substrate 5 or the support 6 with a vacuum laminator such as TEAM-100 and TEAM-300 manufactured by Takatori Corporation when a wafer is used.

The laminate 7 as a support and the substrate on which the temporary adhesive layers (A), (B), and (C) have been formed is formed into a bonded substrate via the layers (A), (B), and (C). At this time, this substrate is compressed by uniform compression under vacuum (under reduced pressure; at a pressure of 1 Pa or less) at a temperature in the range of preferably 40 to 200° C., more preferably 60 to 180° C. to form the laminate (laminated substrate) 7 in which the layers (A), (B), and (C) are adhered and the substrate are bonded to the support. At this stage, the time for contact bonding is 10 seconds to 10 minutes, preferably 30 seconds to 5 minutes.

Examples of a substrate-bonding apparatus include a commercially available wafer-bonding apparatus such as EVG520IS and 850 TB manufactured by EVG Group, and XBS300 manufactured by SUSS MicroTec AG when a wafer is used.

[Step (b)]

Step (b) is a step of heat curing the second temporary adhesive layer (B) and the third temporary adhesive layer (C) in the laminate 7. After the laminate (laminated substrate) 7 is formed, the laminate is heated at 120 to 220° C., preferably 150 to 200° C., for 10 minutes to 4 hours, preferably 30 minutes to 2 hours, to cure the second temporary adhesive layer (B) and the third temporary adhesive layer (C).

[Step (c)]

Step (c) is a step of grinding or polishing the surface to be processed (back surface) of the substrate bonded to the support, i.e., a step of grinding or polishing the back surface of the substrate of the laminate 7 in the step (a) to reduce the thickness of the substrate. The technique for grinding the back surface of the substrate surface is not particularly limited, and known grinding techniques may be used. The grinding is preferably performed while water is fed to the substrate and a grinding wheel (e.g. diamond) for cooling. Examples of an apparatus for grinding the substrate back surface include DAG-810 manufactured by DISCO Co., Ltd. The substrate back surface may be subjected to CMP polishing.

[Step (d)]

Step (d) is a step of processing the surface to be processed of the laminate, the back surface (non-circuit-forming surface) of which has been grinded, i.e., the surface to be processed of the laminate 7 that has been thinned by grinding the back surface. This step includes various processes applied in the substrate level. Examples thereof include electrode formation, metal wiring formation, and protective film formation. More specifically, there may be mentioned well-known processes including metal sputtering for forming electrodes or the like, wet etching for etching a sputtered metal layer, patterning process in which a resist is applied and subjected to exposure and development to form a pattern used as a mask for metal wiring formation, resist removal, dry etching, plating with metal, silicon etching for forming a TSV, and formation of an oxide film on silicon surface.

[Step (e)]

Step (e) is a step of separating the substrate 5 processed in the step (d) from the support 6, i.e., a step of separating the substrate 5 from the support 6 after the thinned wafer is subjected to various processes and before dicing. This separating step is generally carried out under relatively low temperature conditions from room temperature to about 60° C. This step may performed by a method in which either the substrate 5 or the support 6 of the laminate 7 is horizontally fixed, and the other is lifted at a certain angle with respect to the horizontal direction; or a method in which a protective film is bonded to the processed surface of the processed substrate, and then the substrate and the protective film are separated from the laminate by peeling.

Both the separating methods can be applied to the present invention, although it is not limited to these methods. These separating methods are usually carried out at room temperature.

The inventive method for manufacturing a thin wafer preferably involves step (f) performed after the step (e).

[Step (f)]

Step (f) is a step of cleaning the temporary adhesive material remained on the surface of the substrate after the separation in the step (e). The temporary adhesive material layer sometimes remains on the surface of the substrate 5 separated from the support 6 in the step (e). The temporary adhesive material layer can be removed by cleaning the substrate or by a method in which a self-adhesive film is adhered onto the surface of the substrate, i.e., the surface on which the temporary adhesive material layer has been remained, and the self-adhesive film and the temporary adhesive material layer are concurrently separated.

In the step (f), any cleaning solution can be used so long as the solution can dissolve the thermoplastic resin in the first temporary adhesive layer. Illustrative examples thereof include pentane, hexane, cyclohexane, decane, isononane, p-menthane, pinene, isododecane, and limonene. These solvents may be used alone, or a combination of two or more kinds thereof. If removal is difficult, a base or an acid may be added to the solvent. Examples of the usable base include amines such as ethanolamine, diethanolamine, triethanolamine, triethylamine, and ammonia; and ammonium salts such as tetramethylammonium hydroxide. Examples of the usable acid include organic acids such as acetic acid, oxalic acid, benzenesulfonic acid, and dodecylbenzenesulfonic acid. The amount thereof is 0.01 to 10 mass %, preferably 0.1 to 5 mass % in terms of concentration in the cleaning solution. To improve removal efficiency of the residual matters, an existing surfactant may be added thereto. Cleaning may be performed by paddling with the above-mentioned solution, spraying, or dipping in a cleaner tank. The temperature in this operation is preferably 10 to 80° C., more preferably 15 to 65° C. If necessary, after dissolving the layer (A) in the dissolving solution, the substrate may be finally rinsed with water or an alcohol and then dried to obtain a thin wafer.

EXAMPLES

In the following, the present invention will be specifically described with reference to Examples and Comparative Examples, but the present invention is not limited to these Examples. In the following examples, part means part by mass, Me represents a methyl group, and Vi represents a vinyl group.

Resin Solution Preparation Example 1

As a hydrogenated styrene-isoprene-butadiene copolymer, 24 g of thermoplastic elastomer SEPTON 4033 (styrene content: 30%, KURARAY CO., LTD.) was dissolved into 176 g of isononane to give 12 mass % of isononane solution of hydrogenated styrene-isoprene-butadiene copolymer. The obtained solution was filtrated through a 0.2-μm membrane filter to give an isononane solution of thermoplastic resin (A-1).

Resin Solution Preparation Example 2

As a hydrogenated styrene-isoprene-butadiene copolymer, 30 g of thermoplastic elastomer SEPTON 4044 (styrene content: 32%, KURARAY CO., LTD.) was dissolved into 176 g of isononane to give 12 mass % of isononane solution of hydrogenated styrene-isoprene-butadiene copolymer. The obtained solution was filtrated through a 0.2-μm membrane filter to give an isononane solution of thermoplastic resin (A-2).

Resin Solution Preparation Example 3

To a solution consists of 100 parts of polydimethylsiloxane having 3 mol % of vinyl groups on both terminals and the side chain with the molecular terminals being terminated with SiMe$_2$Vi groups and having a number average molecular weight (Mn) of 50,000 determined by GPC as well as 400 parts of isododecane, 10 parts of organohydrogenpolysiloxane (2 mol per alkenyl group) shown by the following formula (M-7) was added and mixed. Further, a platinum catalyst CAT-PL-5 (available from Shin-Etsu Chemical Co., Ltd.) was added in an amount of 0.05 parts based on 100 parts of the polydimethylsiloxane. This was filtrated through a 0.2-μm membrane filter to give a thermosetting siloxane polymer solution (C-1).

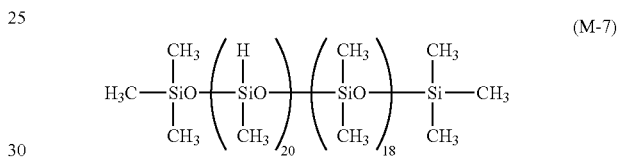

Resin Solution Preparation Example 4

To a solution consists of 100 parts of polydimethylsiloxane having 3 mol % of vinyl groups on both terminals and the side chain with the molecular terminals being terminated with SiMe$_2$Vi groups and having a number average molecular weight (Mn) of 50,000 determined by GPC as well as 400 parts of isododecane, 5 parts of organohydrogenpolysiloxane (2 mol per alkenyl group) shown by the following formula (M-6) was added and mixed. Further, a platinum catalyst CAT-PL-5 (available from Shin-Etsu Chemical Co., Ltd.) was added in an amount of 0.05 parts based on 100 parts of the polydimethylsiloxane. This was filtrated through a 0.2-μm membrane filter to give a thermosetting siloxane polymer solution (C-2).

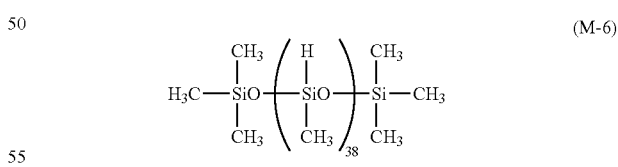

Resin Solution Preparation Example 5

To a solution consists of 100 parts of polydimethylsiloxane having 3 mol % of vinyl groups on both terminals and the side chain with the molecular terminals being terminated with SiMe$_2$Vi groups and having a number average molecular weight (Mn) of 80,000 determined by GPC as well as 400 parts of isododecane, 16 parts of organohydrogenpolysiloxane (6 mol per alkenyl group) shown by the above formula (M-6) was added and mixed. Further, a platinum catalyst CAT-PL-5 (available from Shin-Etsu Chemical Co., Ltd.) was added in an amount of 0.05 parts based on 100 parts of the polydimethylsiloxane. This was filtrated through a 0.2-µm membrane filter to give a thermosetting siloxane polymer solution (C-3).

Resin Solution Preparation Example 6

In a flask equipped with a stirrer, a thermometer, a nitrogen purge system, and a reflux condenser were put 43.1 g of 9,9'-bis(3-allyl-4-hydroxyphenyl)fluorene (M-1), 29.5 g of organohydrogensiloxane having the average structural formula (M-3), 135 g of toluene, and 0.04 g of chloroplatinic acid, and the mixture was heated at 80° C. Then, 17.5 g of 1,4-bis(dimethylsilyl)benzene (M-5) was added dropwise into the flask over 1 hour. At this time, the temperature inside the flask was increased to 85° C. After completion of dropwise addition, the mixture was aged at 80° C. for 2 hours, toluene was then distilled off, and 80 g of cyclohexanone was added thereto to obtain a resin solution containing cyclohexanone as a solvent with a concentration of the resin solid of 50 mass %. When the molecular weight of the resin in the solution was measured by GPC, the weight average molecular weight was 45,000 in terms of polystyrene. Then, 50 g of the resin solution was mixed with 7.5 g of an epoxy crosslinker, EOCN-1020 available from NIPPON KAYAKU Co., Ltd., as a crosslinker, 0.2 g of BSDM (bis(tert-butylsulfonyl)diazomethane) available from Wako Pure Chemical Industries Ltd., as a curing catalyst, and 0.1 g of tetrakis[methylene-(3,5-di-tert-butyl-4-hydroxyhydrocinnamate)]methane (product name: Adekastab AO-60) as an antioxidant. The solution was then filtered through a 1-µm membrane filter to obtain a resin solution (B-1). The cured film of (B-1) exhibited a modulus of 300 MPa at 25° C. measured by dynamic viscoelasticity measurement. The dynamic modulus was measured in accordance with JIS K7244.

Resin Solution Preparation Example 7

In a 5 L-flask equipped with a stirrer, a thermometer, a nitrogen purge system, and a reflux condenser, 84.1 g of epoxy compound (M-2) was dissolved in 600 g of toluene, subsequently, 294.6 g of compound (M-3), and 25.5 g of compound (M-4) were added, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 600 g of methyl isobutyl ketone (MIBK) was added thereto. This reaction solution was filtered under pressure through a filter to remove the platinum catalyst. The solvent in the resin solution was distilled off under reduced pressure, and 270 g of propylene glycol monomethyl ether acetate (PGMEA) was added thereto to obtain a resin solution containing PGMEA as a solvent with a concentration of the solid component of 60 mass %. When the molecular weight of the resin in the resin solution was measured by GPC, the weight average molecular weight was 28,000 in terms of polystyrene. Then, 100 g of the resin solution was mixed with 9 g of a tetra-functional phenol compound, TEP-TPA (available from Asahi Organic Chemicals Industry Co., Ltd.), and 0.2 g of tetrahydrophthalic anhydride (available from New Japan Chemical Co., Ltd., RIKACID HH-A). The solution was then filtered through a 1-µm membrane filter to obtain a resin solution (B-2). The cured film of (B-2) exhibited a modulus of 500 MPa at 25° C. measured by dynamic viscoelasticity measurement.

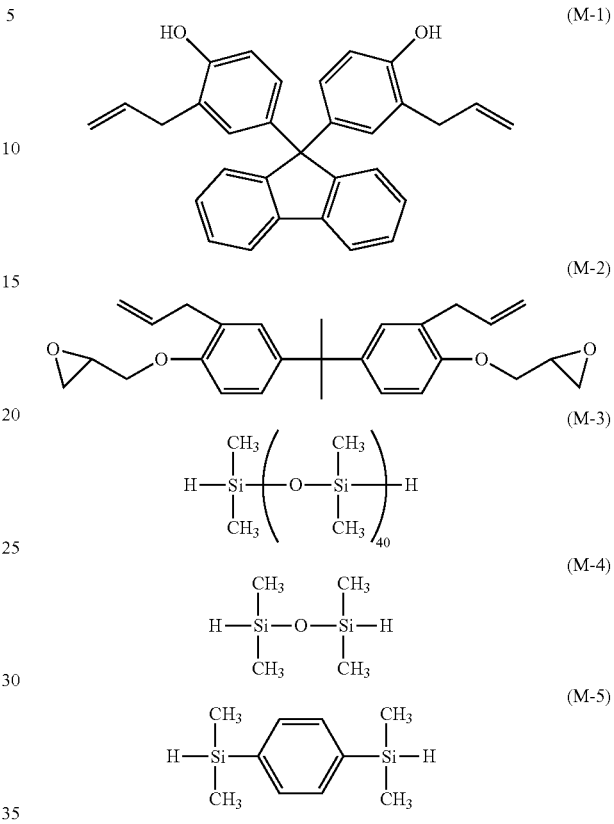

Resin Solution Preparation Example 2

In a four-necked flask, 90 parts of dimethylpolysiloxane shown by the following formula (7), which is a crude rubber-state dimethylpolysiloxane with the both terminals of the molecular chain being terminated with hydroxy groups having a viscosity of 98,000 mPa·s at 25° C. in the 30% toluene solution, was dissolved to 900 parts of toluene, together with 10 parts of methylpolysiloxane resin composed of a $(CH_3)_3SiO_{0.5}$ unit and an $SiO_2$ unit in a ratio of 0.75 mol:1 mol containing 1.0 mol % of hydroxy groups in 100 parts of the solid content. To the obtained solution, 1 part of 28 mass % aqueous ammonia was added, and this was stirred at room temperature for 24 hours to perform condensation reaction. Subsequently, this was heated to 180° C. under reduced pressure to remove toluene, water formed by condensation, ammonia, etc., and a solidified partially condensed material was obtained thereby. The partially condensed material was dissolved by adding 900 parts of toluene. To this solution, 20 parts of hexamethylsilazane was added, and this was stirred at 130° C. for 3 hours to terminate the remaining hydroxy groups. Then, this was heated to 180° C. under reduced pressure to remove solvent and so on, and a solidified non-reactive partially condensed material was obtained thereby. To 100 parts of the non-reactive partially condensed material, 900 parts of hexane was added to dissolve the non-reactive partially condensed material. This was put into 2,000 parts of acetone, and the precipitated resin was collected. Thereafter, hexane, etc., were removed under reduced pressure to obtain a dimethylpolysiloxane polymer having a weight average molecular weight of 900,000 and containing 0.05 mass % of a low molecular weight component having a molecular weight of 740 or less determined by GPC. To 80 g of isododecane, 20 g of this polymer was dissolved, and the solution was filtered through a 0.2-μm membrane filter to obtain an isododecane solution (C-4) of the dimethylpolysiloxane polymer.

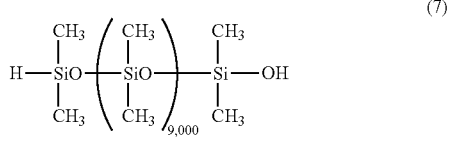

(7)

Example 1

—Film Production Step—

The thermoplastic resin solution (A-1) was applied onto a polyethylene terephthalate (PET) film (thickness: 38 μm) as a release backing at a coating rate of 0.4 m/min by using a comma coater as a film coater, and then dried to produce a first temporary adhesive layer, (A-1) layer. Subsequently, the resin solution (B-1) was applied onto the (A-1) layer had been formed at a coating rate of 0.4 m/min by using a comma coater as a film coater, and then dried to produce a second temporary adhesive layer, (B-1) layer. Furthermore, the thermosetting siloxane polymer solution (C-1) was applied onto the (B-1) layer on the (A-1) layer had been formed at a coating rate of 0.4 m/min by using a comma coater as a film coater, and then dried to produce a third temporary adhesive layer, (C-1) layer. To the surface of the (C-1) layer of the produced film, a polyethylene (PE) film (thickness: 100 μm) was adhered as a protective film at a pressure of 1 MPa. This was rolled-up around a plastic tube at a rate of 0.4 m/min and a tension of 30 N to form a film roll with the diameter of 130 mm.

—Bonded Wafer Production Step—

Subsequently, a 200-mm diameter glass plate (thickness 500 μm) was prepared as a support. In a vacuum laminator TEAM-100 (Takatori Corporation), the degree of vacuum in the vacuum chamber was set to 80 Pa, and the composite film-shaped temporary-adhesive material composed of (A-1) layer, (B-1) layer, and (C-1) layer was unwound from the temporary adhesive film roll for substrate processing while separating the protective film and laminated on the support such that (C-1) layer was deposited on the support, and then the release backing was removed.

Then, the glass plate having the composite film-shaped temporary-adhesive material and a 200-mm diameter silicon wafer (thickness: 725 μm) the entire surface of which was formed with copper posts having height of 40 and diameter of 40 μm were bonded such that the copper posts surface of the silicon wafer and the (A-1) layer surface of the composite film-shaped temporary-adhesive material on the glass plate were faced with each other in a vacuum bonding apparatus (EVG520IS) under the conditions shown in Table 1 to produce a laminate. This was performed with the bonding temperature of a value described in Table 1, the pressure in the chamber of $10^{-3}$ mbar or less at bonding, and loading of 5 kN. The laminate was heated at 120° C. for 1 minute to be subjected to adhesion and bonding. Subsequently, the laminate was heated at 180° C. for 1 hour by using an oven to cure the (B-1) layer and the (C-1) layer to form a sample.

Examples 2 to 5 and Comparative Examples 2 to 4

The same treatment as in Example 1 was performed under the conditions described in Table 1 to prepare samples.

Comparative Example 1

The resin composition solution (A-1) was spin coated onto a 200-mm diameter silicon wafer (thickness: 725 μm) the entire surface of which was formed with copper posts having height of 40 μm and diameter of 40 μm, and then heated at 150° C. for 5 minutes with a hot plate to form a first temporary adhesive layer, (A-1)' layer on the wafer bump-forming surface with a film thickness shown in Table 1. On the other hand, a 200-mm diameter glass plate (thickness: 500 μm) was prepared as a support. First, the resin composition solution (C-1) was spin coated onto this support, and then heated at 150° C. for 5 minutes with a hot plate to form a third temporary adhesive layer, (C-1)' layer on the glass support with a film thickness shown in Table 1. Subsequently, the solution of thermosetting siloxane polymer (B-1) was spin coated onto the (C-1)' layer formed on the glass support to form a second temporary adhesive layer, (B-1)' layer with a film thickness shown in Table 1. This was heated at 150° C. for 3 minutes with a hot plate. Thus formed silicon wafer having the (A-1)' layer composed of a thermoplastic resin was bonded with the glass plate having the thermosetting (C-1)' layer and the (B-1)' layer on the (C-1)' layer so that the resin surfaces faced each other in a vacuum bonding apparatus under the conditions shown in Table 1 to produce a wafer processing laminate. The wafer processing laminate was heated at 120° C. for 1 minute, and was adhered and bonded thereby. Then, the substrate (glass plate) was heated at 180° C. for 1 hour by using an oven to cure the (B-1)' layer and the (C-1)' layer to form a sample.

In the above examples, the glass plate was used as the support for the purpose of visually observing abnormalities after bonding the substrate, but a substrate such as a wafer, which does not transmit light, can be used instead.

Thereafter, the bonded substrate (sample) was subjected to the following tests. The results of Examples and Comparative Examples are shown in Table 1. In addition, evaluations were carried out in order described below. When the result was judged as "poor" after the back surface grinding resistance test, the evaluation thereafter was stopped.

—Adhesion Test—

The laminate (sample) obtained by heat curing at 180° C. for 1 hour in an oven as described above was cooled to room temperature, and the adhesion state of the interface was visually observed. When no abnormality like bubbles was found at the interface, the laminate was evaluated as good, and shown with "good". When an abnormality was found, the laminate was evaluated as poor, and shown with "poor".

—Back Surface Grinding Resistance Test—

The laminate (sample) obtained by heat curing at 180° C. for 1 hour in an oven as described above was subjected to grinding of the back surface of the silicon wafer by a grinder (DAG810, manufactured by DISCO Co., Ltd.) with a diamond grinding wheel. After the wafer was ground to a final substrate thickness of 50 μm, abnormities such as crack and separation were checked with an optical microscope (100-folds). When no abnormity was found, the laminate was evaluated as good, and shown with "good", and when an abnormity was found, the laminate was evaluated as poor, and shown with "poor".

—CVD Resistance Test—

The wafer processing laminate after grinding the back surface of the silicon wafer was introduced into a CVD apparatus, subjected to an experiment to form a $SiO_2$ film with the thickness of 2 μm, and abnormities were visually checked. When no abnormality was found, the sample was evaluated as good, and shown with "good". When any of a void, scab on the wafer, breakage of the wafer, etc. was found, the sample was evaluated as poor, and shown with "poor". The conditions of the CVD resistance test were as follows:

apparatus: plasma CVD PD270STL (manufactured by Samco Inc.)

RF: 500 W, internal pressure: 40 Pa

TEOS (tetraethyl orthosilicate): $O_2$=20 sccm:680 sccm.

—Separation Test—

Separation ability of the substrate was evaluated in the following manner. First, a dicing tape was bonded to the wafer side of the wafer processing laminate after finishing the CVD resistance test, in which the wafer had been thinned to 50 μm, with a dicing frame. This dicing tape surface was set to a suction plate by vacuum suction. Then, one point of the glass was lifted by tweezers at room temperature to separate the glass substrate. When it could be separated without cracking the 50-μm wafer, the laminate was evaluated as good, and shown with "good". When an abnormality such as cracking occurred, the laminate was evaluated as poor, and shown with "poor".

—Cleaning Removability Test—

After the separation test, the 200-mm wafer (which had been exposed to the heat resistance test condition) mounted on the dicing frame via the dicing tape was set on a spin coater. Isononane was then sprayed as a cleaning solution for 3 minutes, and the wafer was rinsed by spraying isopropyl alcohol (IPA) while the wafer was rotated. Thereafter, appearance of the wafer was observed, and residue of the adhesive material resin was visually checked. When no resin remained, the laminate was evaluated as good, and shown with "good". When the resin remained, the laminate was evaluated as poor, and shown with "poor".

—Peeling Force Test—

The composite film-shaped temporary-adhesive material produced by using a 200-mm diameter silicon wafer A (thickness 725 μm) as a support was laminated so that the silicon wafer faced to the third temporary adhesive layer, and the release backing was removed. Then, a 200-mm diameter silicon wafer B (thickness 725 μm), with the surface being subjected to release molding treatment previously, and the support having the film-shaped temporary-adhesive material for substrate processing were adhered in a vacuum bonding apparatus under the conditions shown in Table 1 so that the release molding treated surface of the silicon wafer B and the surface of the first temporary adhesive layer of the temporary adhesive material layer on the support faced each other to produce a laminate. This laminate was heated at 120° C. for 1 minute to be subjected to adhesion and bonding. Subsequently, the laminate was heated at 180° C. for 1 hour by using an oven to cure the second temporary adhesive layer and the third temporary adhesive layer. From the laminate, only the silicon wafer B was removed to produce a laminate in which the silicon wafer A, the third temporary adhesive layer, the second temporary adhesive layer, and the first temporary adhesive layer were laminated in order.

Thereafter, five polyimide tapes each having a length of 150 mm and a width of 25 mm were bonded onto the first temporary adhesive layer of the laminate, and a part of the temporary adhesive layer to which no tape has been bonded was removed. 120 mm of the tapes were then peeled off from one end by 180° peeling at a rate of 300 ram/min under an atmosphere of 25° C. with AUTOGRAPH (AG-Xplus) manufactured by Shimadzu Co., and an average force applied at this time (120 mm stroke, 5 times) was measured as a peeling force of the temporary adhesive layer.

TABLE 1

|  | Example | | | | |
| --- | --- | --- | --- | --- | --- |
|  | 1 | 2 | 3 | 4 | 5 |
| First temporary adhesive layer | A-1 | A-1 | A-2 | A-1 | A-1 |
| Film thickness of first temporary adhesive layer | 40 μm | 40 μm | 30 μm | 10 μm | 20 μm |
| Second temporary adhesive layer | B-1 | B-1 | B-1 | B-2 | B-1 |
| Film thickness of second temporary adhesive layer | 20 μm | 20 μm | 20 μm | 30 μm | 30 μm |
| Third temporary adhesive layer | C-1 | C-2 | C-2 | C-2 | C-3 |
| Film thickness of third temporary adhesive layer | 15 μm | 10 μm | 5 μm | 15 μm | 10 μm |
| Form | Film | Film | Film | Film | Film |
| Adhesion temperature | 120° C. | 120° C. | 120° C. | 140° C. | 120° C. |
| Adhesion time | 1 min | 1 min | 1 min | 3 min | 1 min |
| Curing temperature | 180° C. | 180° C. | 180° C. | 180° C. | 180° C. |
| Curing time | 1 h | 1 h | 1 h | 1 h | 1 h |
| Adhesion | Good | Good | Good | Good | Good |
| Back surface grinding resistance | Good | Good | Good | Good | Good |
| CVD resistance | Good | Good | Good | Good | Good |
| Separation | Good | Good | Good | Good | Good |
| Cleaning removability | Good | Good | Good | Good | Good |
| Peeling force | 100 mN | 100 mN | 80 mN | 120 mN | 150 mN |

TABLE 1-continued

|  | Comparative Example | | | |
| --- | --- | --- | --- | --- |
|  | 1 | 2 | 3 | 4 |
| First temporary adhesive layer | A-1' | A-1 | A-1 | — |
| Film thickness of first temporary adhesive layer | 40 μm | 40 μm | 30 μm | — |
| Second temporary adhesive layer | B-1' | B-1 | B-1 | B-1 |
| Film thickness of second temporary adhesive layer | 20 μm | 20 μm | 30 μm | 50 μm |
| Third temporary adhesive layer | C-1' | C-4 | — | C-2 |
| Film thickness of third temporary adhesive layer | 15 μm | 5 μm | — | 10 μm |
| Form | Liquid | Film | Film | Film |
| Adhesion temperature | 120° C. | 120° C. | 120° C. | 120° C. |
| Adhesion time | 1 min | 1 min | 1 min | 1 min |
| Curing temperature | 180° C. | 180° C. | 180° C. | 180° C. |
| Curing time | 1 h | 1 h | 1 h | 1 h |
| Adhesion | Poor | Good | Good | Poor |
| Back surface grinding resistance | — | Good | Good | — |
| CVD resistance | — | Poor | Good | — |
| Separation | — | — | Poor | — |
| Cleaning removability | — | — | — | — |
| Peeling force | — | 100 mN | 1000 mN | — |

As shown in Table 1, it was found that the composite film-shaped temporary-adhesive material unwound from the temporary adhesive film roll for substrate processing, satisfying the requirements of the present invention, facilitated temporary adhesion between a substrate and a support, was easily separated, and excelled in CVD resistance and cleaning removability in particular (Examples 1 to 5). On the other hand, Comparative Example 1, with the form being liquid, showed poor adhesion. In comparative Example 2, the third temporary adhesive layer failed to satisfy the requirements of the present invention (which was not a thermosetting resin), and the CVD resistance was poor. Comparative Example 3, without using a third temporary adhesive layer, showed poor separation. In Comparative Example 4, a first temporary adhesive layer composed of a thermoplastic resin was not used, the adhesion was problematic, and post-treatment could not be performed.

It should be noted that the present invention is not limited to the foregoing embodiments. The embodiments are just exemplification, and any examples that have substantially the same feature and demonstrate the same functions and effects as those in the technical concept described in claims of the present invention are included in the technical scope of the present invention.

The invention claimed is:

1. A temporary adhesive film roll for substrate processing, comprising:
    a roll axis and a composite film-shaped temporary-adhesive material for temporarily bonding a substrate to be processed to a support, the composite film-shaped temporary-adhesive material being rolled up around the roll axis;
    wherein the composite film-shaped temporary-adhesive material includes a first temporary adhesive layer (A) composed of a thermoplastic resin, a second temporary adhesive layer (B) composed of a thermosetting resin, and a third temporary adhesive layer (C) composed of a thermosetting resin which is different from that of the second temporary adhesive layer.

2. The temporary adhesive film roll for substrate processing according to claim 1, further comprising a release backing, wherein
    the release backing and the composite film-shaped temporary-adhesive material formed on the release backing are rolled up around the roll axis together, and
    the composite film-shaped temporary-adhesive material includes the first temporary adhesive layer (A), the second temporary adhesive layer (B), and the third temporary adhesive layer (C) formed in order from a side of the release backing.

3. The temporary adhesive film roll for substrate processing according to claim 2, wherein a cured film of the second temporary adhesive layer (B) exhibits a modulus of 50 MPa or more and 1 GPa or less at 25° C. measured by dynamic viscoelasticity measurement.

4. The temporary adhesive film roll for substrate processing according to claim 2, wherein a cured film of the third temporary adhesive layer (C) exhibits a peeling force of 20 mN/25 mm or more and 500 mN/25 mm or less to peel the cured film from the substrate or the support in a peel test at 25° C. in a direction of 180° degree.

5. The temporary adhesive film roll for substrate processing according to claim 2, wherein the peeling force is 10 mN/25 mm or more and 400 mN/25 mm or less to peel the release backing from the composite film-shaped temporary-adhesive material in a peel test at 25° C. in a direction of 180° degree.

6. The temporary adhesive film roll for substrate processing according to claim 1, wherein a cured film of the second temporary adhesive layer (B) exhibits a modulus of 50 MPa or more and 1 GPa or less at 25° C. measured by dynamic viscoelasticity measurement.

7. The temporary adhesive film roll for substrate processing according to claim 1, wherein a cured film of the third temporary adhesive layer (C) exhibits a peeling force of 20 mN/25 mm or more and 500 mN/25 mm or less to peel the cured film from the substrate or the support in a peel test at 25° C. in a direction of 180° degree.

8. The temporary adhesive film roll for substrate processing according to claim 1, wherein the third temporary adhesive layer (C) is a layer of a composition containing:

(C1) an organopolysiloxane having an alkenyl group in the molecule;
(C2) an organohydrogenpolysiloxane having two or more silicon atom-bonded hydrogen atoms (Si—H groups) per molecule, in such an amount that a mole ratio of the Si—H group in the component (C2) to the alkenyl group in the component (C1) ranges from 0.3 to 15; and
(C3) a platinum-based catalyst.

9. The temporary adhesive film roll for substrate processing according to claim 1, wherein the second temporary adhesive layer (B) is a polymer layer composed of a composition containing 100 parts by mass of a siloxane bond-containing polymer having a repeating unit shown by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol groups or alkoxymethylol groups per molecule, and an epoxy compound having on average two or more epoxy groups per molecule,

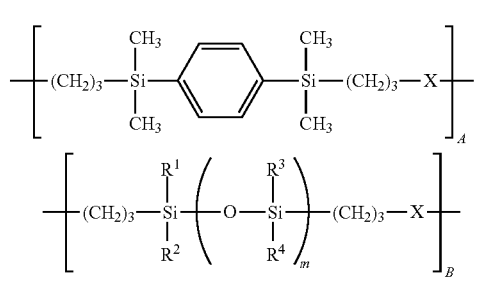

wherein $R^1$ to $R^4$ may be the same or different, and represent a monovalent hydrocarbon group having 1 to 8 carbon atoms; "m" is an integer of 1 to 100; B is a positive number; A is 0 or a positive number, with the proviso that A+B=1; and X is a divalent organic group shown by the following general formula (2),

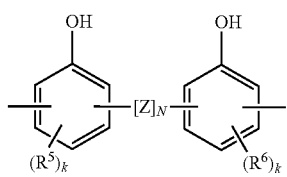

wherein Z represents a divalent organic group selected from any of

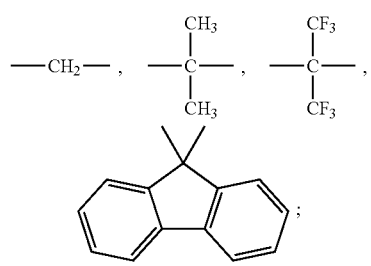

N represents 0 or 1; $R^5$ and $R^6$ each represent an alkyl or alkoxy group having 1 to 4 carbon atoms, and may be the same or different from each other; and "k" represents any of 0, 1, and 2.

10. The temporary adhesive film roll for substrate processing according to claim 1, wherein the second temporary adhesive layer (B) is a polymer layer composed of a composition containing 100 parts by mass of a siloxane bond-containing polymer having a repeating unit shown by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

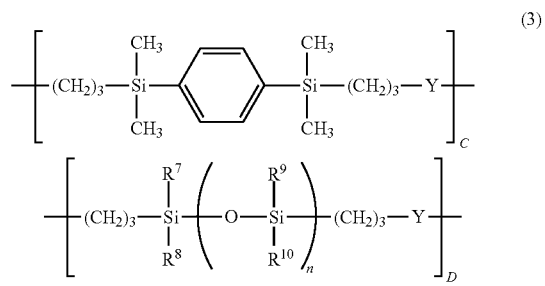

wherein $R^7$ to $R^{10}$ may be the same or different, and represent a monovalent hydrocarbon group having 1 to 8 carbon atoms; "n" is an integer of 1 to 100; D is a positive number; C is 0 or a positive number, with the proviso that C+D=1; and Y is a divalent organic group shown by the following general formula (4),

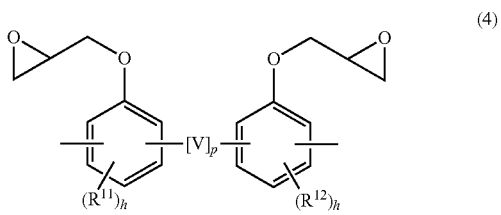

wherein V represents a divalent organic group selected from any of

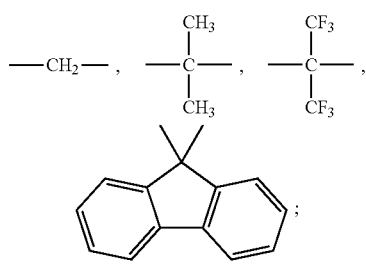

"p" represents 0 or 1; $R^{11}$ and $R^{12}$ each represent an alkyl or alkoxy group having 1 to 4 carbon atoms, and may be the same or different from each other; and "h" represents any of 0, 1, and 2.

11. The temporary adhesive film roll for substrate processing according to claim 1, wherein the thermoplastic resin has a glass transition temperature of −80 to 150° C. and does not contain organopolysiloxane, the thermoplastic resin being selected from the group consisting of an olefinic thermoplastic elastomer, a polybutadiene type thermoplastic elastomer, a styrenic thermoplastic elastomer, a styrene-butadiene type thermoplastic elastomer, a styrene-polyolefin type thermoplastic elastomer, and a hydrogenated polystyrene type elastomer.

12. A method for manufacturing a thin wafer comprising the steps of:
    (a) a step of bonding a surface opposite to a surface to be processed of the substrate to the support by using the temporary adhesive film roll for substrate processing according to claim 1, wherein the composite film-shaped temporary-adhesive material is unwound from the temporary adhesive film roll, and the composite film-shaped temporary-adhesive material is laminated onto the substrate or the support to bond the substrate and the support through the composite film-shaped temporary-adhesive material under reduced pressure;
    (b) a step of heat curing the second temporary adhesive layer (B) and the third temporary adhesive layer (C);
    (c) a step of grinding or polishing the surface to be processed of the substrate;
    (d) a step of processing the surface to be processed of the substrate; and
    (e) a step of separating the substrate subjected to the processing from the support.

13. A method for manufacturing a thin wafer comprising the steps of:
    (a) a step of bonding a surface opposite to a surface to be processed of the substrate to the support by using the temporary adhesive film roll for substrate processing according to claim 2, wherein the composite film-shaped temporary-adhesive material is unwound from the temporary adhesive film roll, and the composite film-shaped temporary-adhesive material is laminated onto the substrate or the support to bond the substrate and the support through the composite film-shaped temporary-adhesive material under reduced pressure;
    (b) a step of heat curing the second temporary adhesive layer (B) and the third temporary adhesive layer (C);
    (c) a step of grinding or polishing the surface to be processed of the substrate;
    (d) a step of processing the surface to be processed of the substrate; and
    (e) a step of separating the substrate subjected to the processing from the support.

14. A method for manufacturing a thin wafer comprising the steps of:
    (a) a step of bonding a surface opposite to a surface to be processed of the substrate to the support by using the temporary adhesive film roll for substrate processing according to claim 6, wherein the composite film-shaped temporary-adhesive material is unwound from the temporary adhesive film roll, and the composite film-shaped temporary-adhesive material is laminated onto the substrate or the support to bond the substrate and the support through the composite film-shaped temporary-adhesive material under reduced pressure;
    (b) a step of heat curing the second temporary adhesive layer (B) and the third temporary adhesive layer (C);
    (c) a step of grinding or polishing the surface to be processed of the substrate;
    (d) a step of processing the surface to be processed of the substrate; and
    (e) a step of separating the substrate subjected to the processing from the support.

15. A method for manufacturing a thin wafer comprising the steps of:
    (a) a step of bonding a surface opposite to a surface to be processed of the substrate to the support by using the temporary adhesive film roll for substrate processing according to claim 3, wherein the composite film-shaped temporary-adhesive material is unwound from the temporary adhesive film roll, and the composite film-shaped temporary-adhesive material is laminated onto the substrate or the support to bond the substrate and the support through the composite film-shaped temporary-adhesive material under reduced pressure;
    (b) a step of heat curing the second temporary adhesive layer (B) and the third temporary adhesive layer (C);
    (c) a step of grinding or polishing the surface to be processed of the substrate;
    (d) a step of processing the surface to be processed of the substrate; and
    (e) a step of separating the substrate subjected to the processing from the support.

16. A method for manufacturing a thin wafer comprising the steps of:
    (a) a step of bonding a surface opposite to a surface to be processed of the substrate to the support by using the temporary adhesive film roll for substrate processing according to claim 7, wherein the composite film-shaped temporary-adhesive material is unwound from the temporary adhesive film roll, and the composite film-shaped temporary-adhesive material is laminated onto the substrate or the support to bond the substrate and the support through the composite film-shaped temporary-adhesive material under reduced pressure;
    (b) a step of heat curing the second temporary adhesive layer (B) and the third temporary adhesive layer (C);
    (c) a step of grinding or polishing the surface to be processed of the substrate;
    (d) a step of processing the surface to be processed of the substrate; and
    (e) a step of separating the substrate subjected to the processing from the support.

17. A method for manufacturing a thin wafer comprising the steps of:
    (a) a step of bonding a surface opposite to a surface to be processed of the substrate to the support by using the temporary adhesive film roll for substrate processing according to claim 4, wherein the composite film-shaped temporary-adhesive material is unwound from the temporary adhesive film roll, and the composite film-shaped temporary-adhesive material is laminated onto the substrate or the support to bond the substrate and the support through the composite film-shaped temporary-adhesive material under reduced pressure;
    (b) a step of heat curing the second temporary adhesive layer (B) and the third temporary adhesive layer (C);
    (c) a step of grinding or polishing the surface to be processed of the substrate;
    (d) a step of processing the surface to be processed of the substrate; and
    (e) a step of separating the substrate subjected to the processing from the support.

18. A method for manufacturing a thin wafer comprising the steps of:
    (a) a step of bonding a surface opposite to a surface to be processed of the substrate to the support by using the temporary adhesive film roll for substrate processing according to claim 8, wherein the composite film-shaped temporary-adhesive material is unwound from the temporary adhesive film roll, and the composite film-shaped temporary-adhesive material is laminated onto the substrate or the support to bond the substrate and the support through the composite film-shaped temporary-adhesive material under reduced pressure;
- (b) a step of heat curing the second temporary adhesive layer (B) and the third temporary adhesive layer (C);
- (c) a step of grinding or polishing the surface to be processed of the substrate;
- (d) a step of processing the surface to be processed of the substrate; and
- (e) a step of separating the substrate subjected to the processing from the support.

19. A method for manufacturing a thin wafer comprising the steps of:
- (a) a step of bonding a surface opposite to a surface to be processed of the substrate to the support by using the temporary adhesive film roll for substrate processing according to claim 9, wherein the composite film-shaped temporary-adhesive material is unwound from the temporary adhesive film roll, and the composite film-shaped temporary-adhesive material is laminated onto the substrate or the support to bond the substrate and the support through the composite film-shaped temporary-adhesive material under reduced pressure;
- (b) a step of heat curing the second temporary adhesive layer (B) and the third temporary adhesive layer (C);
- (c) a step of grinding or polishing the surface to be processed of the substrate;
- (d) a step of processing the surface to be processed of the substrate; and
- (e) a step of separating the substrate subjected to the processing from the support.

20. A method for manufacturing a thin wafer comprising the steps of:
- (a) a step of bonding a surface opposite to a surface to be processed of the substrate to the support by using the temporary adhesive film roll for substrate processing according to claim 10, wherein the composite film-shaped temporary-adhesive material is unwound from the temporary adhesive film roll, and the composite film-shaped temporary-adhesive material is laminated onto the substrate or the support to bond the substrate and the support through the composite film-shaped temporary-adhesive material under reduced pressure;
- (b) a step of heat curing the second temporary adhesive layer (B) and the third temporary adhesive layer (C);
- (c) a step of grinding or polishing the surface to be processed of the substrate;
- (d) a step of processing the surface to be processed of the substrate; and
- (e) a step of separating the substrate subjected to the processing from the support.

21. A method for manufacturing a thin wafer comprising the steps of:
- (a) a step of bonding a surface opposite to a surface to be processed of the substrate to the support by using the temporary adhesive film roll for substrate processing according to claim 5, wherein the composite film-shaped temporary-adhesive material is unwound from the temporary adhesive film roll, and the composite film-shaped temporary-adhesive material is laminated onto the substrate or the support to bond the substrate and the support through the composite film-shaped temporary-adhesive material under reduced pressure;
- (b) a step of heat curing the second temporary adhesive layer (B) and the third temporary adhesive layer (C);
- (c) a step of grinding or polishing the surface to be processed of the substrate;
- (d) a step of processing the surface to be processed of the substrate; and
- (e) a step of separating the substrate subjected to the processing from the support.

* * * * *